(12) United States Patent
Chu et al.

(10) Patent No.: US 12,015,060 B2
(45) Date of Patent: Jun. 18, 2024

(54) STRUCTURE AND FORMATION METHOD OF SEMICONDUCTOR DEVICE WITH BACKSIDE CONTACT

(71) Applicant: Taiwan Semiconductor Manufacturing Company, Ltd., Hsinchu (TW)

(72) Inventors: Feng-Ching Chu, Pingtung County (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 288 days.

(21) Appl. No.: 17/357,052

(22) Filed: Jun. 24, 2021

(65) Prior Publication Data

US 2022/0416035 A1 Dec. 29, 2022

(51) Int. Cl.
| | |
|---|---|
| *H01L 29/417* | (2006.01) |
| *H01L 21/84* | (2006.01) |
| *H01L 27/12* | (2006.01) |
| *H01L 29/66* | (2006.01) |
| *H01L 29/423* | (2006.01) |
| *H01L 29/45* | (2006.01) |
| *H01L 29/786* | (2006.01) |

(52) U.S. Cl.
CPC ........ *H01L 29/41733* (2013.01); *H01L 21/84* (2013.01); *H01L 27/12* (2013.01); *H01L 29/66742* (2013.01); *H01L 29/42392* (2013.01); *H01L 29/458* (2013.01); *H01L 29/78696* (2013.01)

(58) Field of Classification Search
CPC ... H01L 29/41733; H01L 21/84; H01L 27/12; H01L 29/66742; H01L 29/42392; H01L 29/458; H01L 29/78696; H01L 29/1079; H01L 29/0673; H01L 29/0847; H01L 29/66439; H01L 29/775; H01L 29/41725; B82Y 10/00
USPC ........................................................ 257/401
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Tong-Ho Kim
(74) *Attorney, Agent, or Firm* — Birch, Stewart, Kolasch & Birch, LLP

(57) ABSTRACT

A semiconductor device structure and a formation method are provided. The semiconductor device structure includes a stack of channel structures and includes a first epitaxial structure and a second epitaxial structure adjacent to opposite sides of the channel structures. The semiconductor device structure also includes a gate stack wrapped around each of the channel structures and a backside conductive contact connected to the second epitaxial structure. The second epitaxial structure is between a top of the backside conductive contact and a top of the gate stack. The semiconductor device structure further includes a dielectric fin stacked over an isolation structure. The dielectric fin is adjacent to the second epitaxial structure, and the isolation structure is adjacent to the backside conductive contact. The isolation structure has a first height, the dielectric fin has a second height, and the second height is greater than the first height.

20 Claims, 33 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0399109 A1* | 12/2021 | Su .................. H01L 21/76898 |
| 2021/0408246 A1* | 12/2021 | Ganguly ........... H01L 21/02532 |
| 2022/0165856 A1* | 5/2022 | Yu .................... H01L 21/76831 |
| 2022/0199624 A1* | 6/2022 | Huang ................ H10B 53/30 |

* cited by examiner

STRUCTURE AND FORMATION METHOD OF SEMICONDUCTOR DEVICE WITH BACKSIDE CONTACT

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
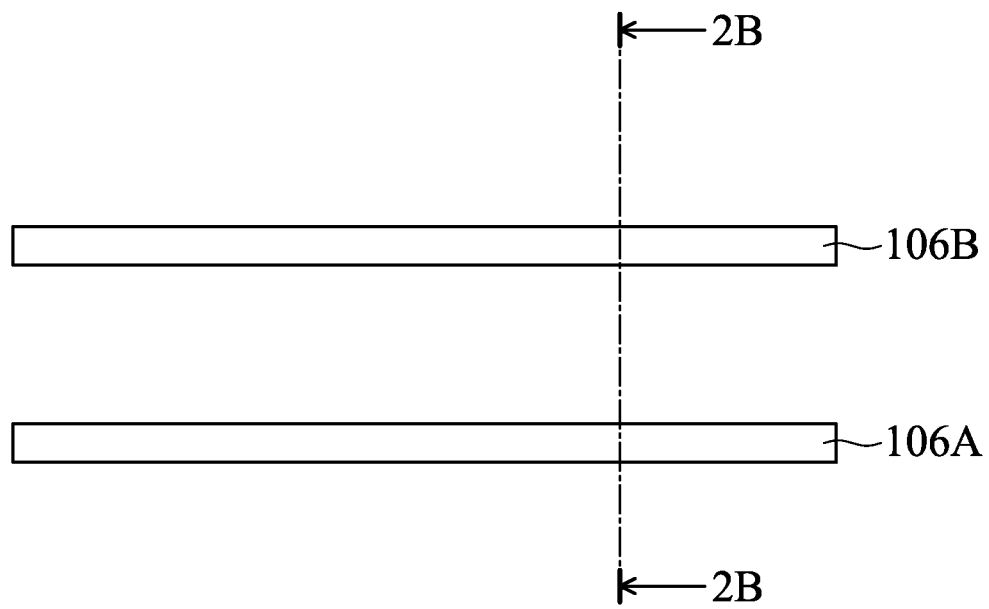
FIGS. 1A-1B are top views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
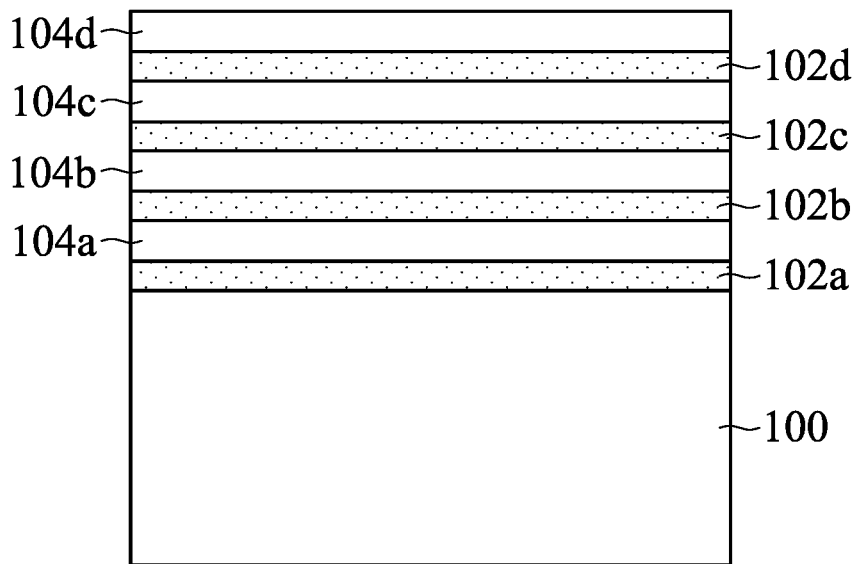
FIGS. 2A-2J are cross-sectional views of various stages of a process for forming a semiconductor device structure, in accordance with some embodiments.

FIGS. 2A-2J are cross-sectional views of various stages of a process for forming a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In the present disclosure, the side of the semiconductor substrate 100 where the semiconductor stack is located is referred to as the frontside. The side opposite to the frontside with respect to the semiconductor substrate 100 is referred to as the backside.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon or silicon germanium. In some embodiments, the sacrificial layers 102a-102d are made of or include silicon germanium with different atomic concentrations of germanium than that of the semiconductor layers 104a-104d to achieve different etching selectivity and/or different oxidation rates during subsequent processing. In some embodiments, the semiconductor layer 104a-104d are substantially free of germanium. In some embodiments, the semiconductor layer 102a-102d have a greater atomic concentration of germanium that that of the semiconductor layers 104a-104d.

The present disclosure contemplates that the semiconductor layers 102a-102d and the semiconductor layers 104a-104d include any combination of materials (such as semiconductor materials) that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
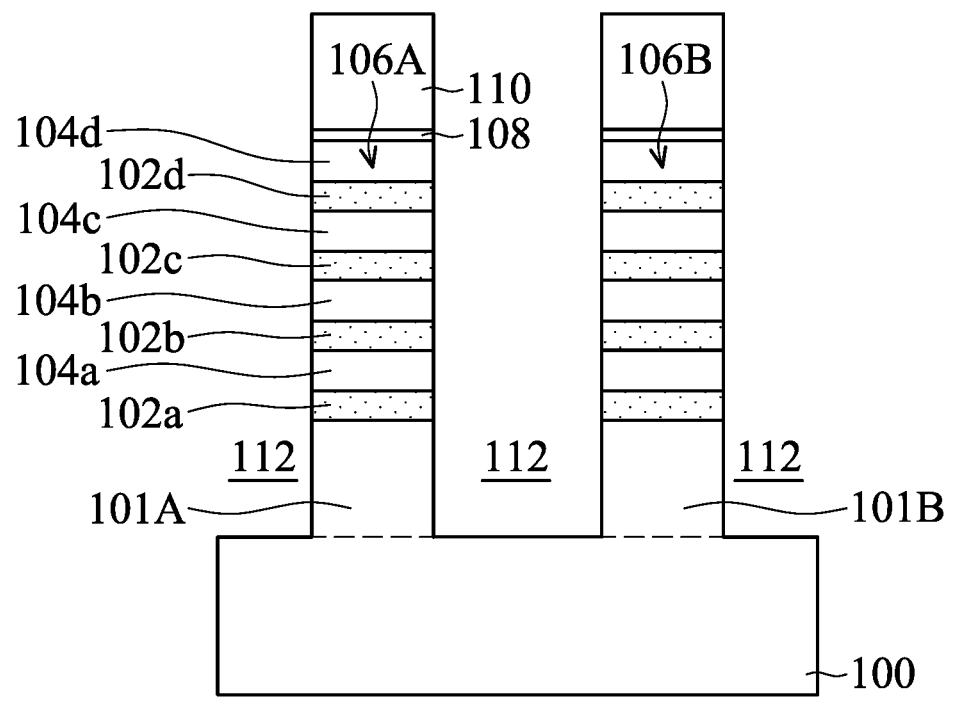

Afterwards, hard mask elements are formed over the semiconductor stack to assist in a subsequent patterning of the semiconductor stack. One or more photolithography processes and one or more etching processes are used to pattern the semiconductor stack into fin structures 106A and 106B, as shown in FIG. 2B in accordance with some embodiments. The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures 106A and 106B may include portions of the semiconductor layers 102a-102d and 104a-104d and semiconductor fins 101A and 101B. The semiconductor substrate 100 may also be partially removed during the etching process that forms the fin structures 106A and 106B. Protruding portions of the semiconductor substrate 100 that remain form the semiconductor fins 101A and 101B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and 104a-104d. The second layer 110 may be made of silicon nitride, silicon oxynitride, silicon carbide, one or more other suitable materials, or a combination thereof.

Figure 1B:
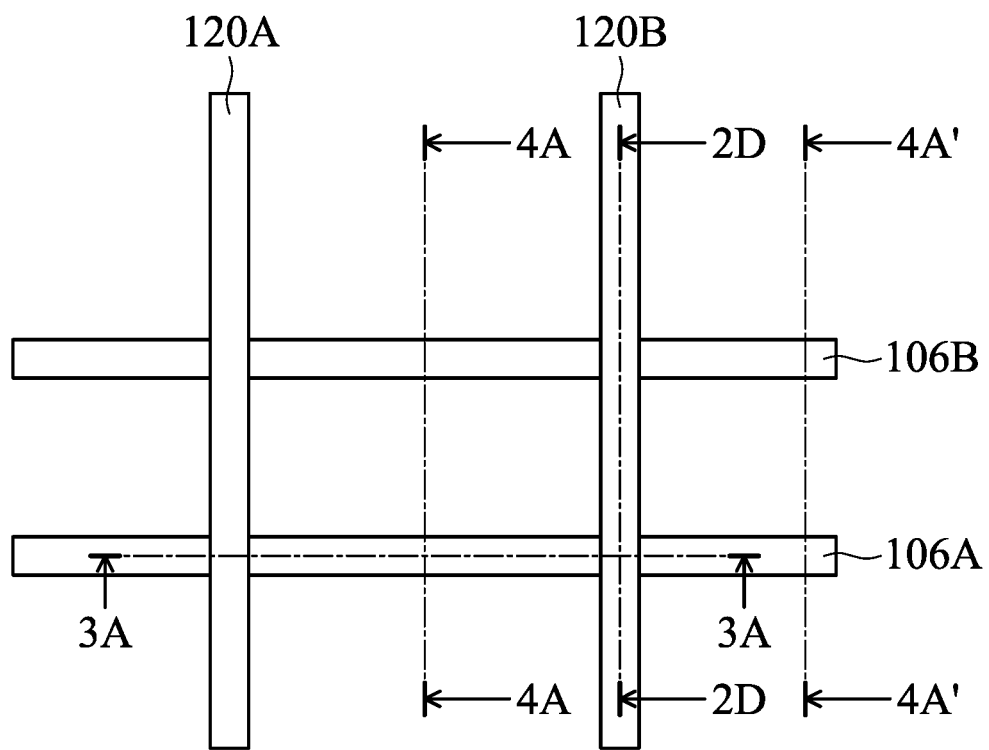

FIGS. 1A-1B are top views of various stages of a process for forming a semiconductor device structure, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
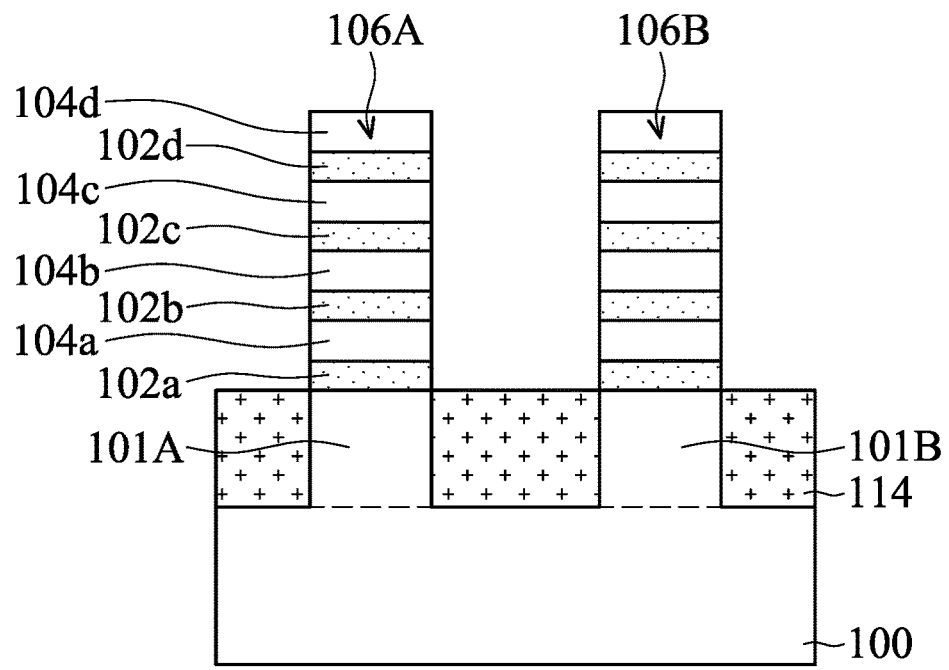

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

In some embodiments, the etching back process for forming the isolation structure 114 is carefully controlled to ensure that the isolation structure 114 has a suitable height (thickness) $H_1$. In some embodiments, the isolation structure 114 is relatively shorter. The height $H_1$ of the isolation structure 114 may be in a range from about 70 nm to about 90 nm.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 114.

Figure 2D:
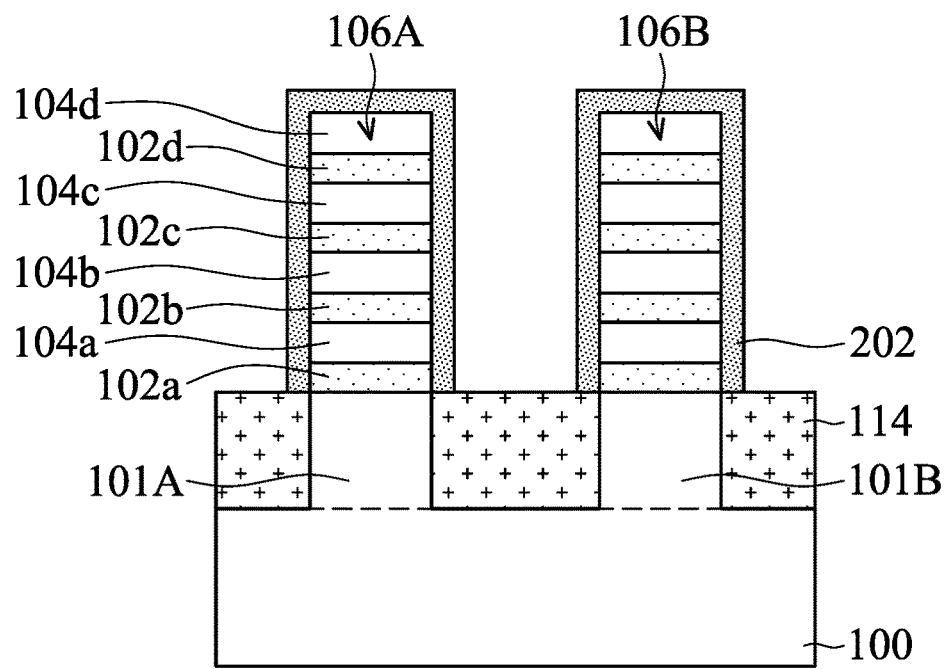

As shown in FIG. 2D, sacrificial spacers 202 are formed on the fin structures 106A and 106B, in accordance with some embodiments. In some embodiments, the sacrificial spacers 202 are selectively formed only on the semiconductor materials. In some embodiments, the sacrificial spacers 202 are epitaxially grown on the exposed surfaces of the fin structures 106A and 106B. The material and formation method of the sacrificial spacers 202 may be the same as or similar to those of the sacrificial layers 102a-102d. A suitable epitaxial growth time is used to form the sacrificial spacers 202 to ensure that each of the sacrificial spacers 202 is formed to have a suitable thickness.

Figure 2E:
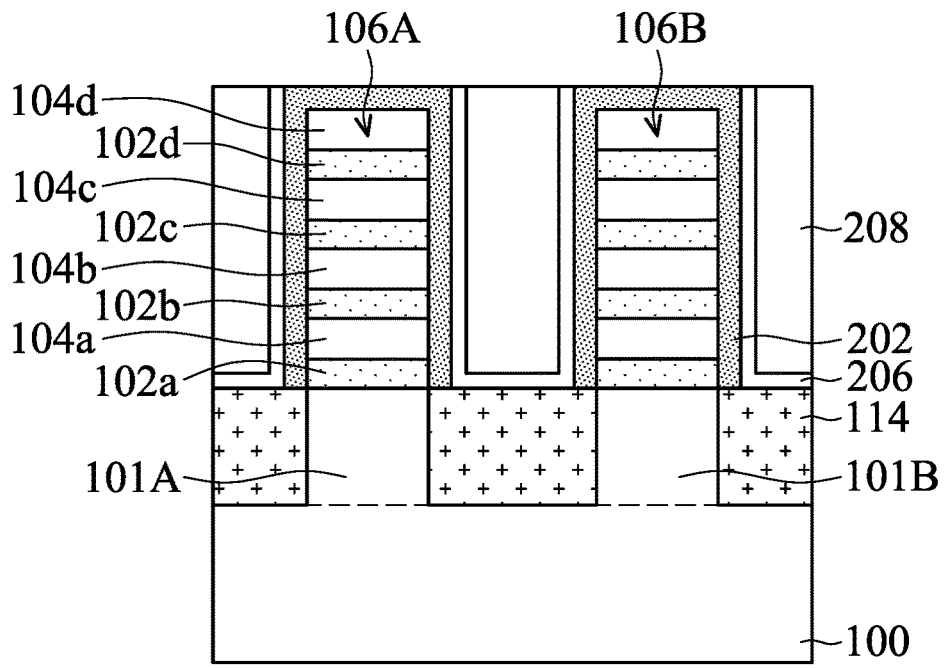

As shown in FIG. 2E, dielectric layers 206 and 208 are sequentially deposited, in accordance with some embodiments. Then, a planarization process is used to partially remove the dielectric layers 206 and 208. In some embodiments, after the planarization process, the top surfaces of the sacrificial spacers 202 and the dielectric layers 206 and 208 are substantially level with each other. The planarization process may include a CMP process, a grinding process, a dry polishing process, an etching process, one or more other applicable processes, or a combination thereof.

The dielectric layer 206 may be made of or include silicon nitride, silicon oxynitride, carbon-containing silicon nitride, carbon-containing silicon oxynitride, one or more other suitable materials, or a combination thereof. The dielectric layer 206 may be deposited using a CVD process, an ALD process, one or more other applicable processes, or a combination thereof. The dielectric layer 208 may be made of or include silicon oxide, silicon carbide, silicon oxycarbide, silicon nitride, silicon oxynitride, carbon-containing silicon nitride, carbon-containing silicon oxynitride, one or more other suitable materials, or a combination thereof. The dielectric layer 208 may be deposited using an FCVD process, a CVD process, an ALD process, one or more other suitable materials, or a combination thereof.

Figure 2F:
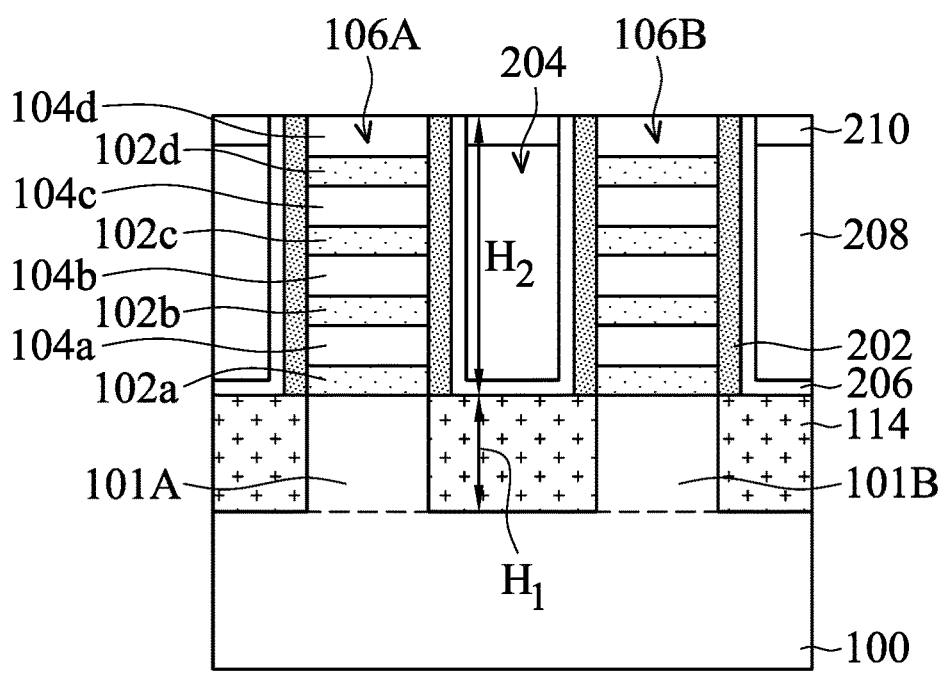

In some embodiments, the dielectric layer 208 is partially removed, in accordance with some embodiments. After the removal of the upper portions of the dielectric layer 208, multiple recesses are formed. Afterwards, protection structures 210 are formed in the recesses, as shown in FIG. 2F in accordance with some embodiments. As a result, dielectric fins 204 that include the dielectric layers 206 and 208 and the protection structures 210 are formed. The dielectric fins 204 may function as blocking structures that prevent the nearby epitaxial structures (that will be subsequently formed) over nearby fin structures from being merged together. In some embodiments, the dielectric fins 204 are in direct contact with the isolation structure 114.

In some embodiments, a protection layer is deposited to overfill the recesses. Afterwards, a planarization process is used to remove the portion of the protection layer outside of the recesses. As a result, the remaining portions of the protection layer in the recesses form the protection structures 210. The planarization process may include a CMP process, a grinding process, a dry polishing process, an etching process, one or more other applicable processes, or a combination thereof.

In some embodiments, the protection layer used for forming the protection structures 210 has a dielectric constant that is different than that of the dielectric layer 206. In some embodiments, the protection layer used for forming the protection structures 210 has a greater dielectric constant than that of the dielectric layer 206. The protection structures 210 may have a dielectric constant that is greater than about 7. The protection layer used for forming the protection structures 210 may be made of or include hafnium oxide, zirconium oxide, aluminum hafnium oxide, aluminum oxide, hafnium silicon oxide, one or more other suitable materials, or a combination thereof. The protection layer used for forming the protection structures 210 may be deposited using a CVD process, an ALD process, one or more other applicable processes, or a combination thereof.

However, embodiments of the disclosure are not limited thereto. Many variations and/or modifications can be made to embodiments of the disclosure. In some other embodiments, the protection layer used for forming the protection structures 210 has a lower dielectric constant than that of the dielectric layer 206.

Many variations and/or modifications can be made to embodiments of the disclosure. In some other embodiments, the protection structures 210 are not formed.

As shown in FIG. 2F, each of the dielectric fins 204 has a height $H_2$. The height $H_2$ may be in a range from about 70 nm to about 120 nm. The height ratio ($H_2/H_1$) of the height $H_2$ to the height $H_1$ may be in a range from about 0.75 to about 1.7 or 1.8. In some embodiments, the height $H_2$ of the dielectric fin 204 is greater than the height $H_1$ of the isolation structure 114. The height ratio ($H_2/H_1$) may be in a range from about 1.1 to about 1.8. However, embodiments of the disclosure are not limited thereto. In some other embodiments, the dielectric fin 204 is substantially as high as the isolation structure 114. In these cases, the height ratio ($H_2/H_1$) is about 1. In some other embodiments, the dielectric fin 204 is shorter than the isolation structure 114. The height $H_2$ is smaller than the height $H_1$. In these cases, the height ratio ($H_2/H_1$) may be in a range from about 0.75 to about 0.99.

Figure 2G:
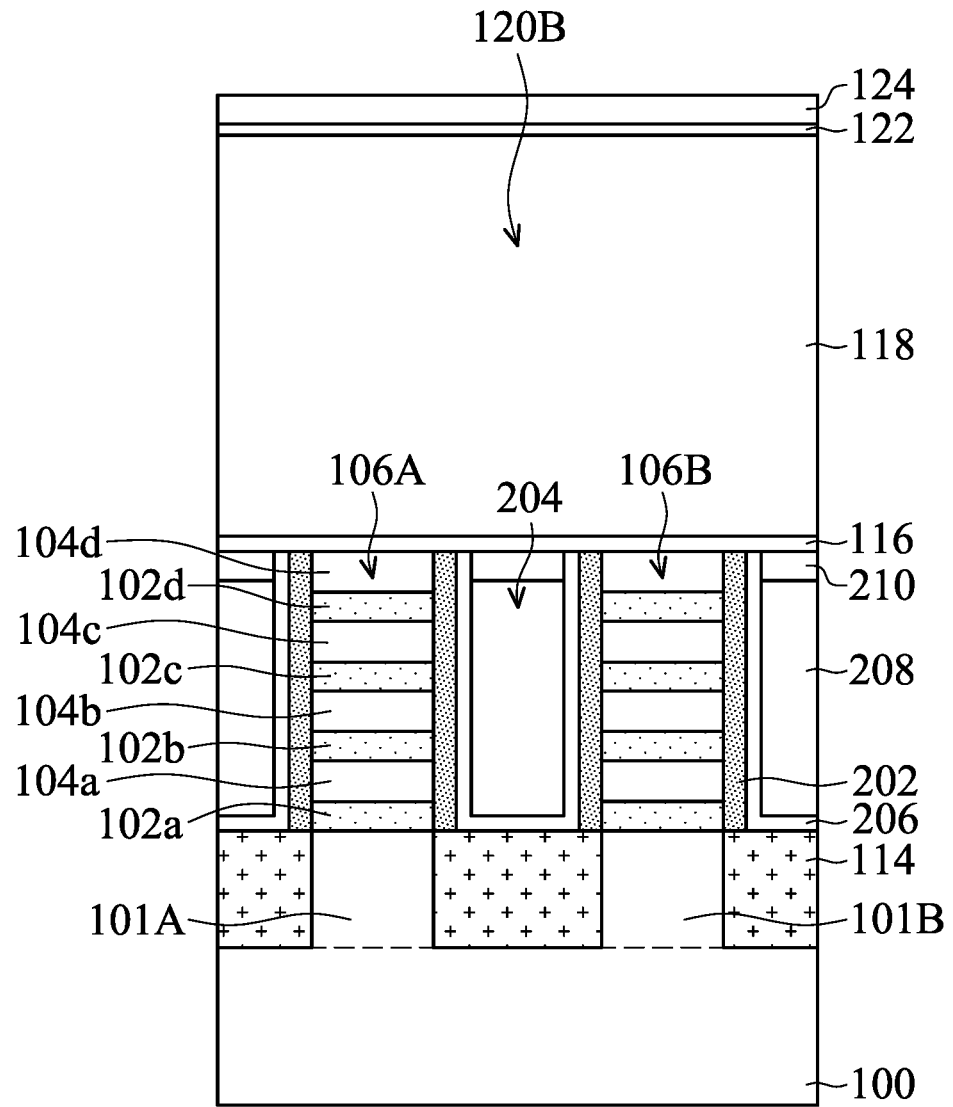
Figure 3A:
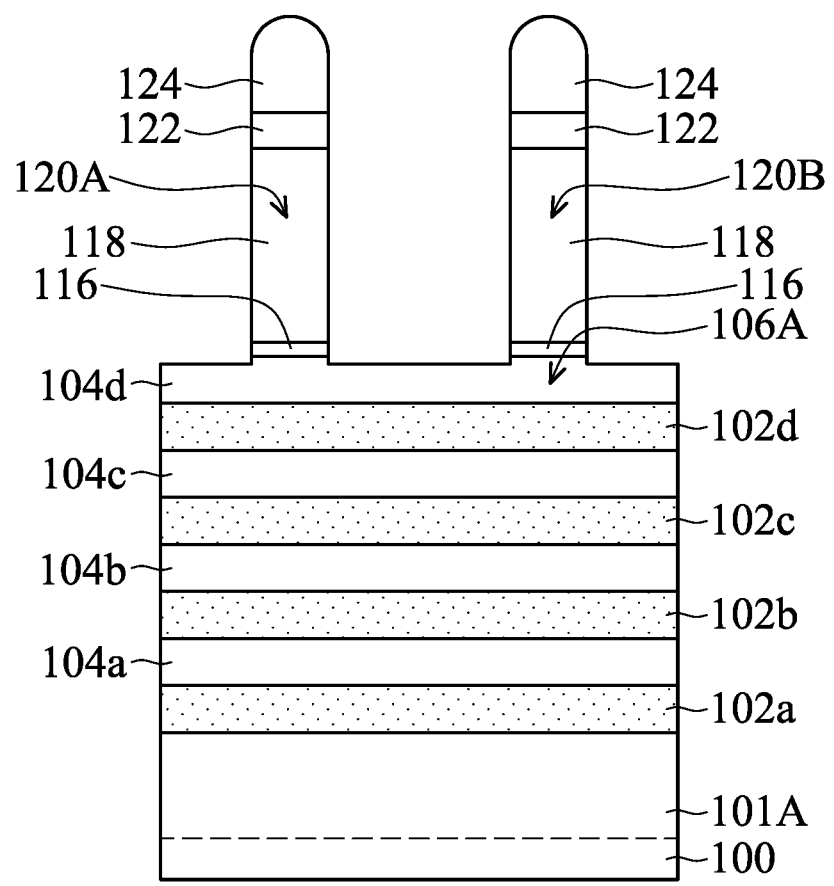
FIGS. 3A-3T are cross-sectional views of various stages of a process for forming a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2G is a cross-sectional view of the structure taken along the line 2G-2G in FIG. 1B. FIGS. 3A-3T are cross-sectional views of various stages of a process for forming a semiconductor device structure, in accordance with some embodiments. In some embodiments, FIG. 3A is a cross-sectional view of the structure taken along the line 3A-3A in FIG. 1B.

As shown in FIGS. 1B, 2G, and 3A, the dummy gate stacks 120A and 120B are formed to partially cover and to extend across the fin structures 106A and 106B, in accordance with some embodiments. In some embodiments, the dummy gate stacks 120A and 120B are wrapped around the fin structures 106A and 106B. As shown in FIG. 2G, the dummy gate stack 120B extends across the fin structures 106A and 106B and the dielectric fins 204.

As shown in FIGS. 2G and 3A, each of the dummy gate stacks 120A and 120B includes a dummy gate dielectric layer 116 and a dummy gate electrode 118. The dummy gate dielectric layer 116 may be made of or include silicon oxide. The dummy gate electrodes 118 may be made of or include polysilicon.

In some embodiments, a dummy gate dielectric material layer and a dummy gate electrode layer are sequentially deposited over the isolation structure 114, the fin structures 106A and 106B, and the dielectric fins 204. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B that include the dummy gate dielectric layer 116 and the dummy gate electrodes 118.

Figure 4A:
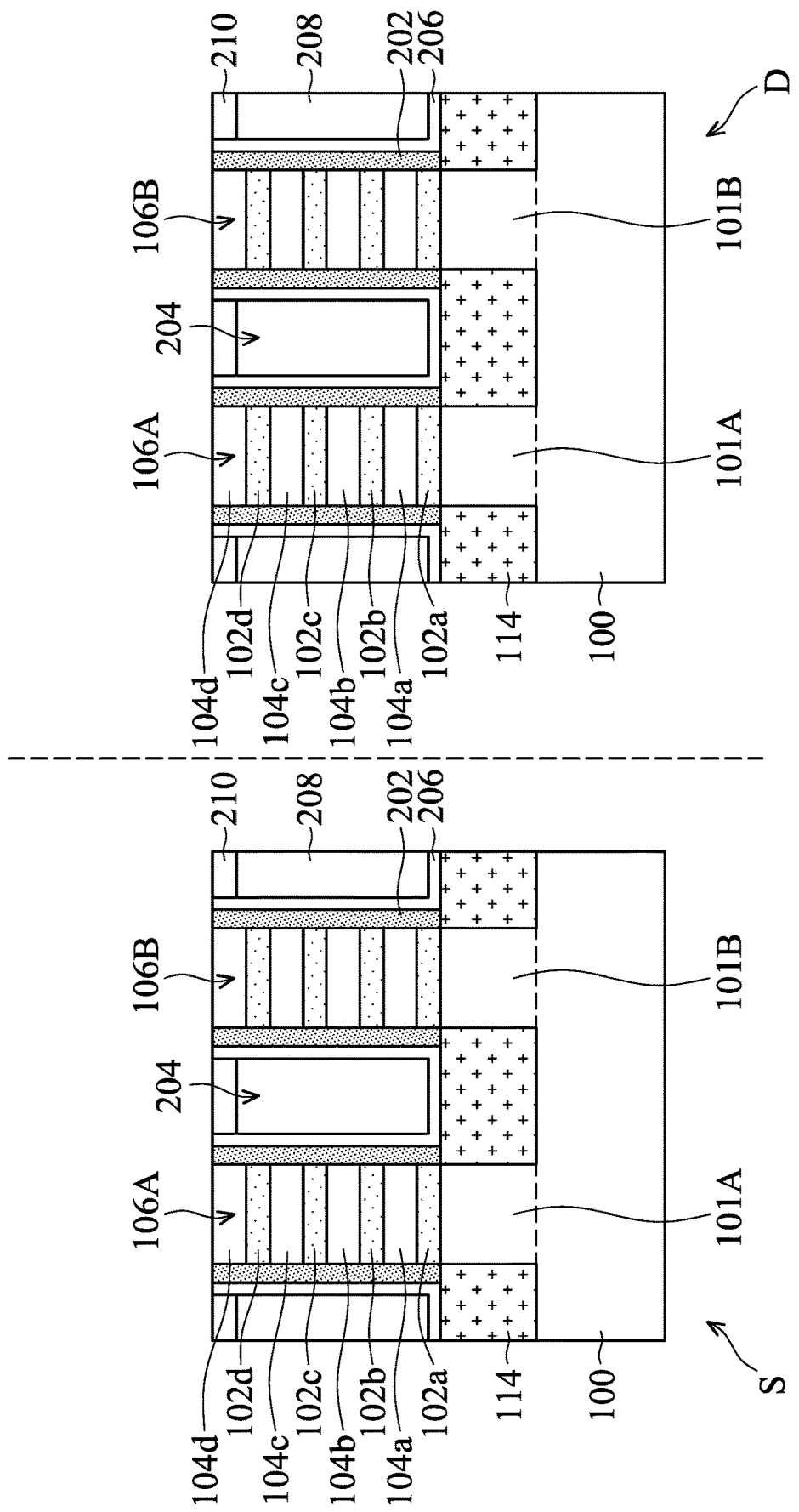
FIGS. 4A-4F are cross-sectional views of various stages of a process for forming a semiconductor device structure, in accordance with some embodiments.

FIGS. 4A-4F are cross-sectional views of various stages of a process for forming a semiconductor device structure, in accordance with some embodiments. In some embodiments, FIG. 4A is a cross-sectional view of the structure taken along the lines 4A-4A and 4A'-4A' in FIG. 1B. As shown in FIG. 4A, the left side shows a first region S that is the cross-sectional view of the structure taken along the line 4A-4A, and the right side shows a second region D that is the cross-sectional view of the structure taken along the line 4A'-4A'. In some embodiments, the first region S shows the elements near a subsequently formed source region, and the second region D shows the elements near a subsequently formed drain region.

Figure 3B:
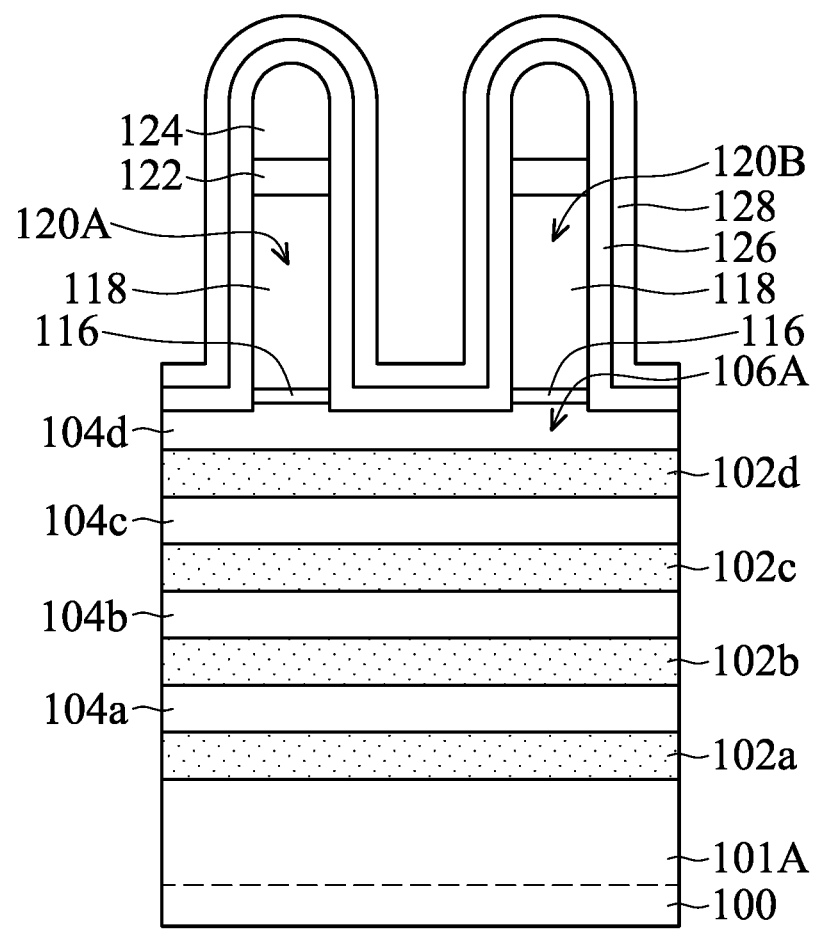

As shown in FIG. 3B, spacer layers 126 and 128 are afterwards deposited over the structure shown in FIG. 3A, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3C:
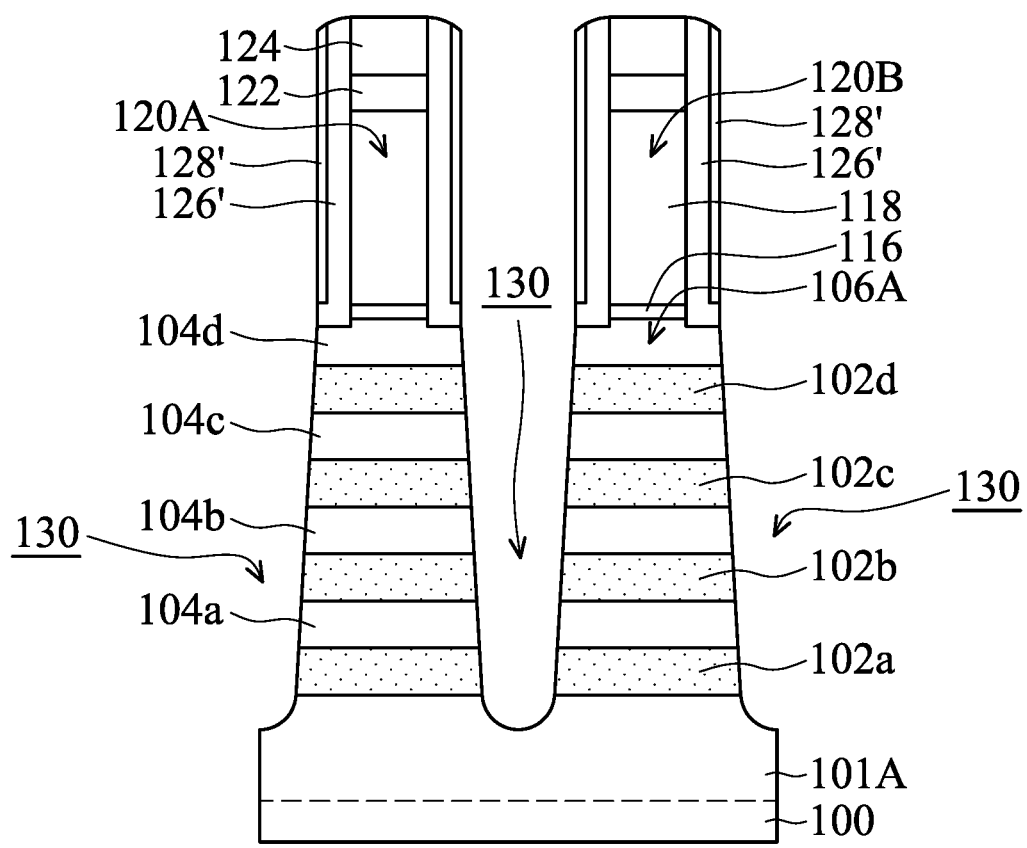

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Figure 4B:
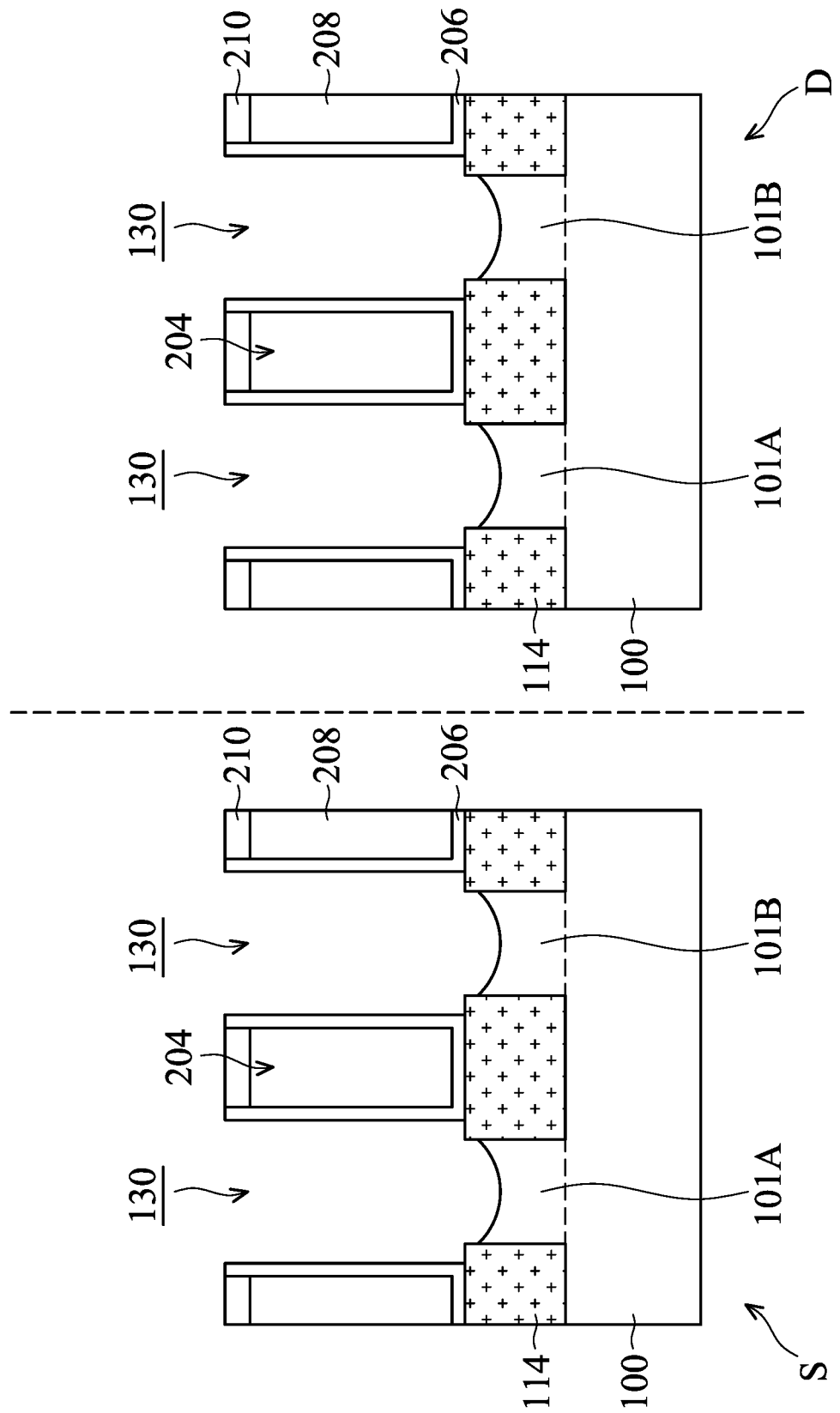

As shown in FIGS. 3C and 4B, the fin structures 106A and 106B are partially removed to form recesses 130, in accordance with some embodiments. The recesses 130 may be used to contain epitaxial structures (such as source/drain structures) that will be formed later. As shown in FIG. 4B, the recesses 130 in the first region S are used to contain source structures that will be formed later. The recesses 130 in the second region D are used to contain drain structures that will be formed later.

One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106A or 106B. In some embodiments, the recesses 130 further extend into the semiconductor fin 101A or 101B, as shown in FIGS. 3C and 4B. In some embodiments, the spacer elements 126' and 128' and the recesses 130 are simultaneously formed using the same etching process.

In some embodiments, each of the recesses 130 has slanted sidewalls, as shown in FIG. 3C. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
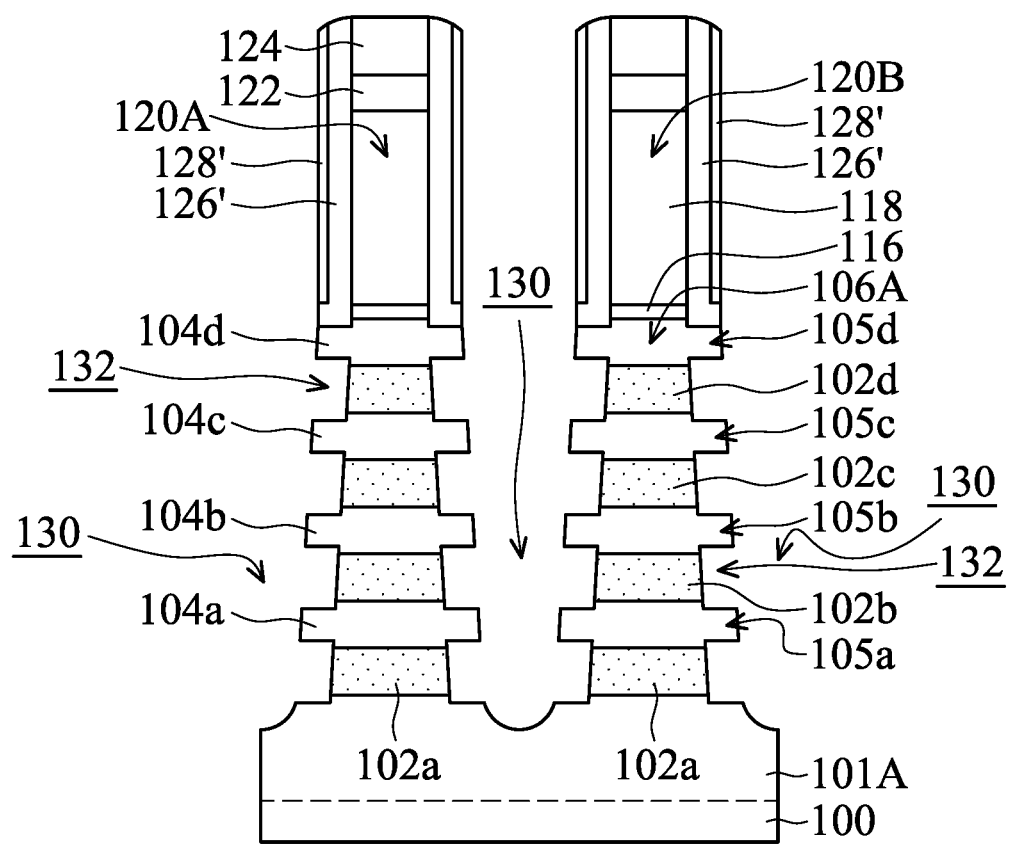

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figure 3E:
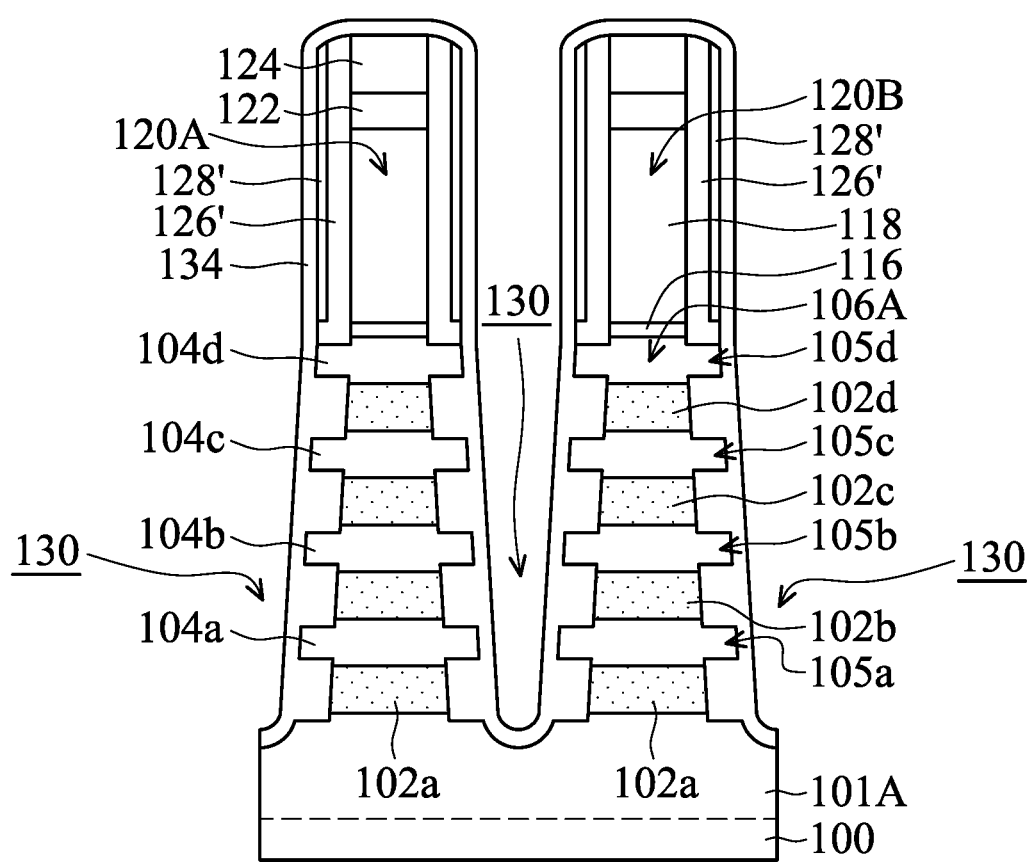

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

Figure 3F:
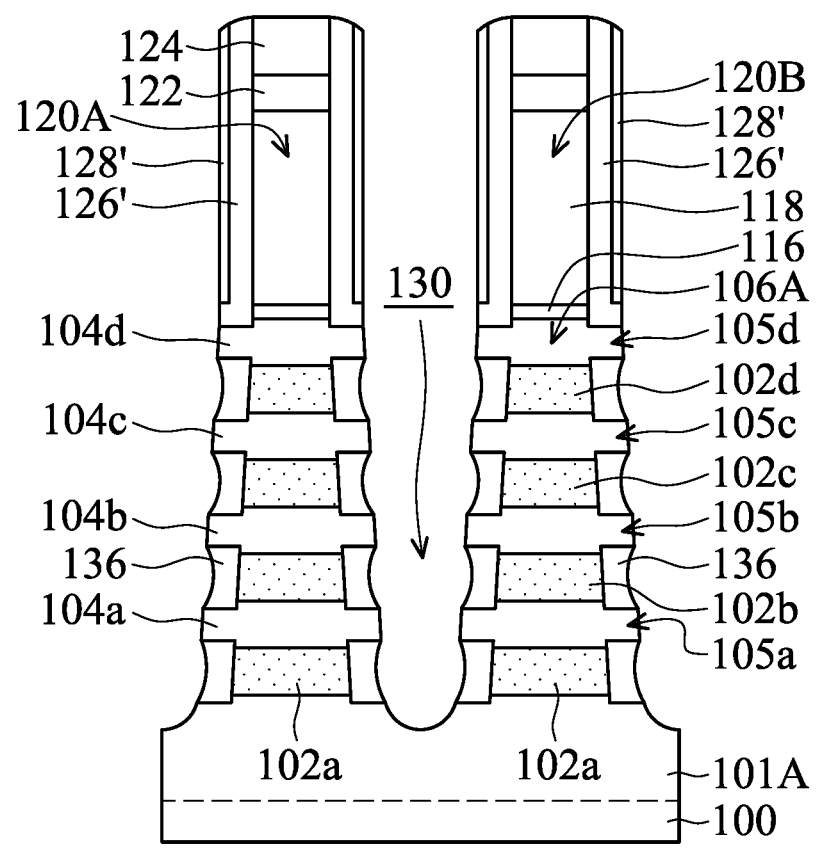

As shown in FIG. 3F, an etching process is used to partially remove the insulating layer 134, in accordance with some embodiments. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (that function as, for example, source/drain structures) from being damaged during a subsequent process for removing the sacrificial layers 102a-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A originally covered by the insulating layer 134 are exposed by the recesses 130, as shown in FIG. 3F. The edges of the semiconductor layers 104a-104d are exposed by the recesses 130, as shown in FIG. 3F.

Figure 3G:
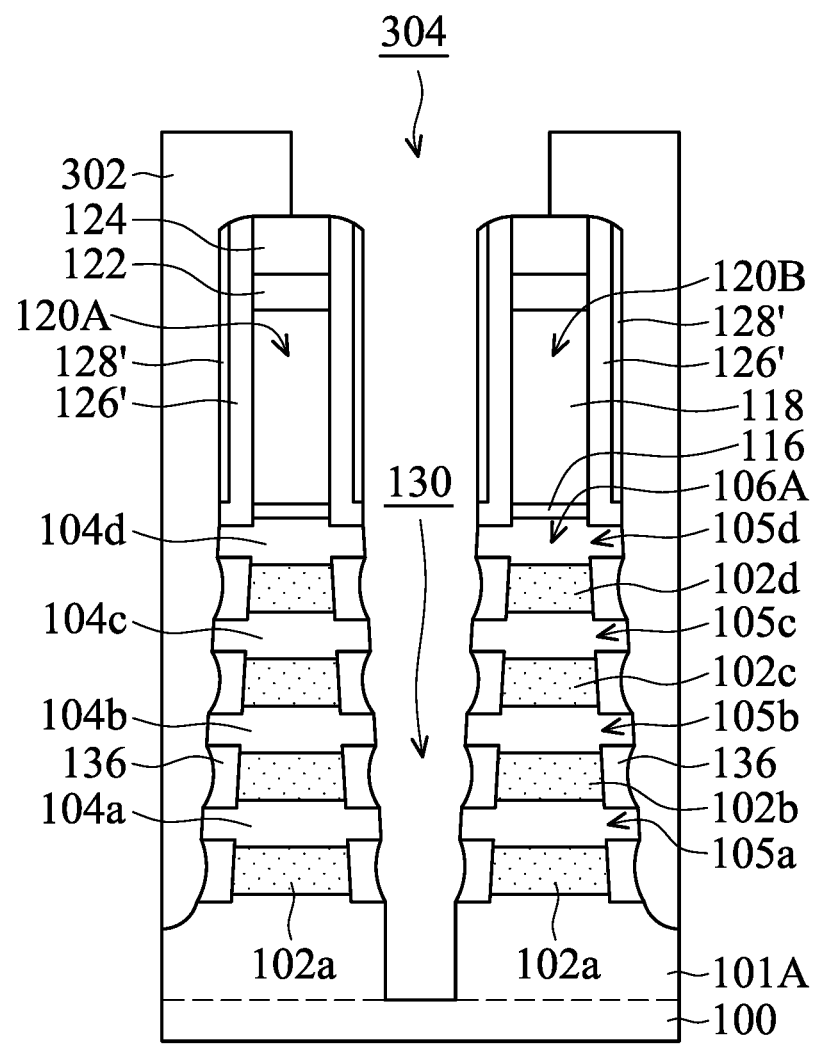
Figure 4C:
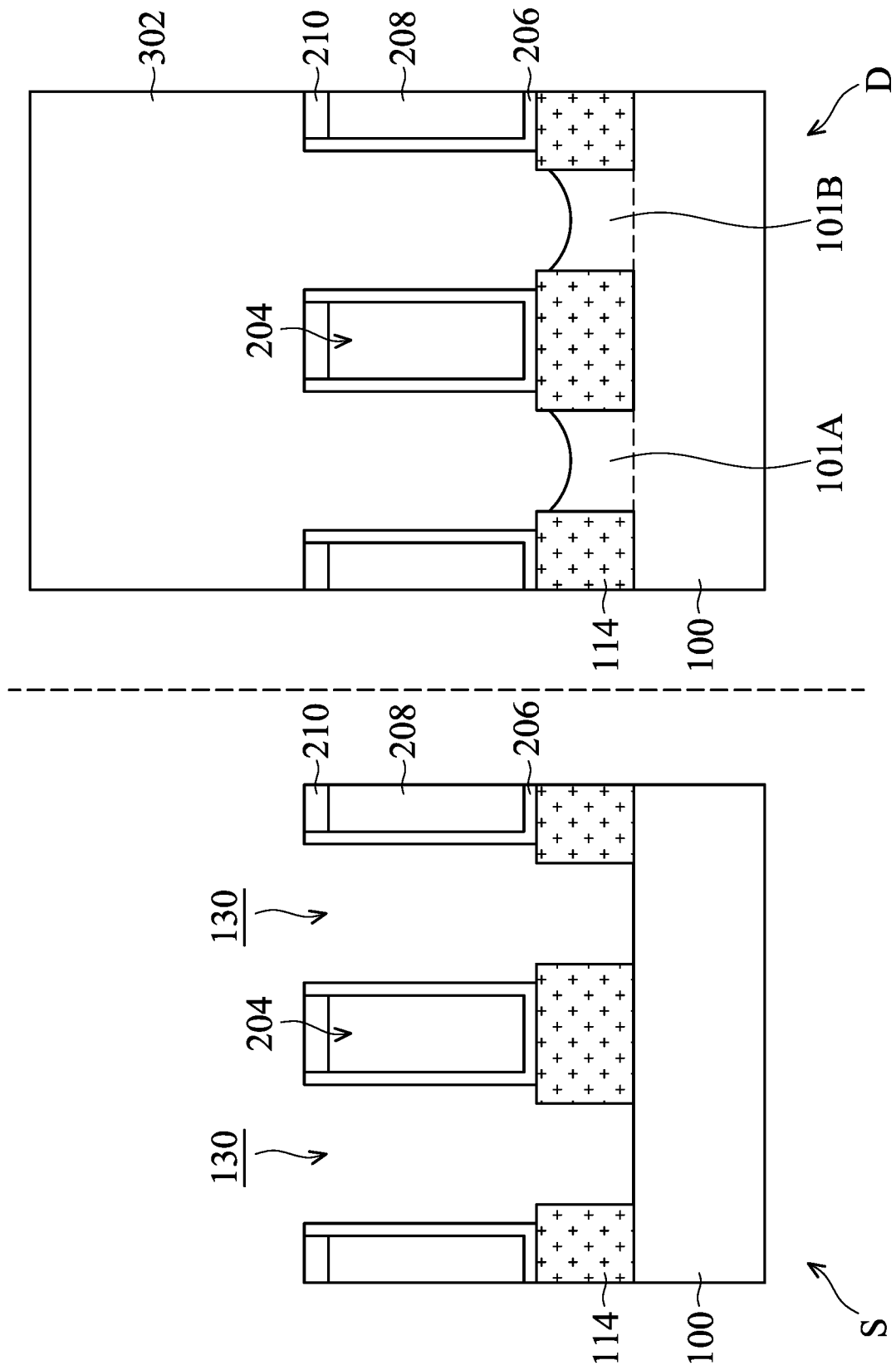

As shown in FIGS. 3G and 4C, a mask element 302 is formed to cover the recesses 130 that are designed to contain the subsequently formed drain structures, in accordance with some embodiments. As shown in FIGS. 3G, and 4C, the mask element 302 has an opening 304 that exposes the recesses 130 that are designed to contain the subsequently formed source structures. Afterwards, one or more etching processes are used to partially remove the semiconductor fins 101A and 101B. As a result, the recesses 130 further extend towards the semiconductor substrate 100. In some embodiments, the extended recesses 130 expose the semiconductor substrate 100, as shown in FIGS. 3G and 4C.

Figure 3H:
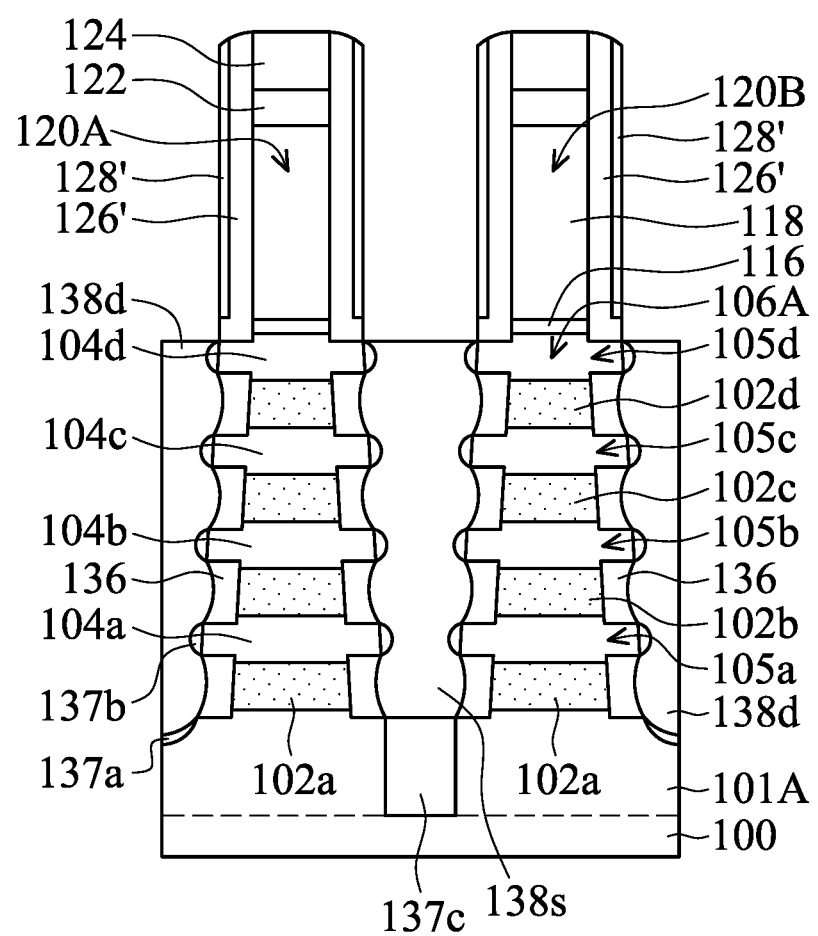
Figure 4D:
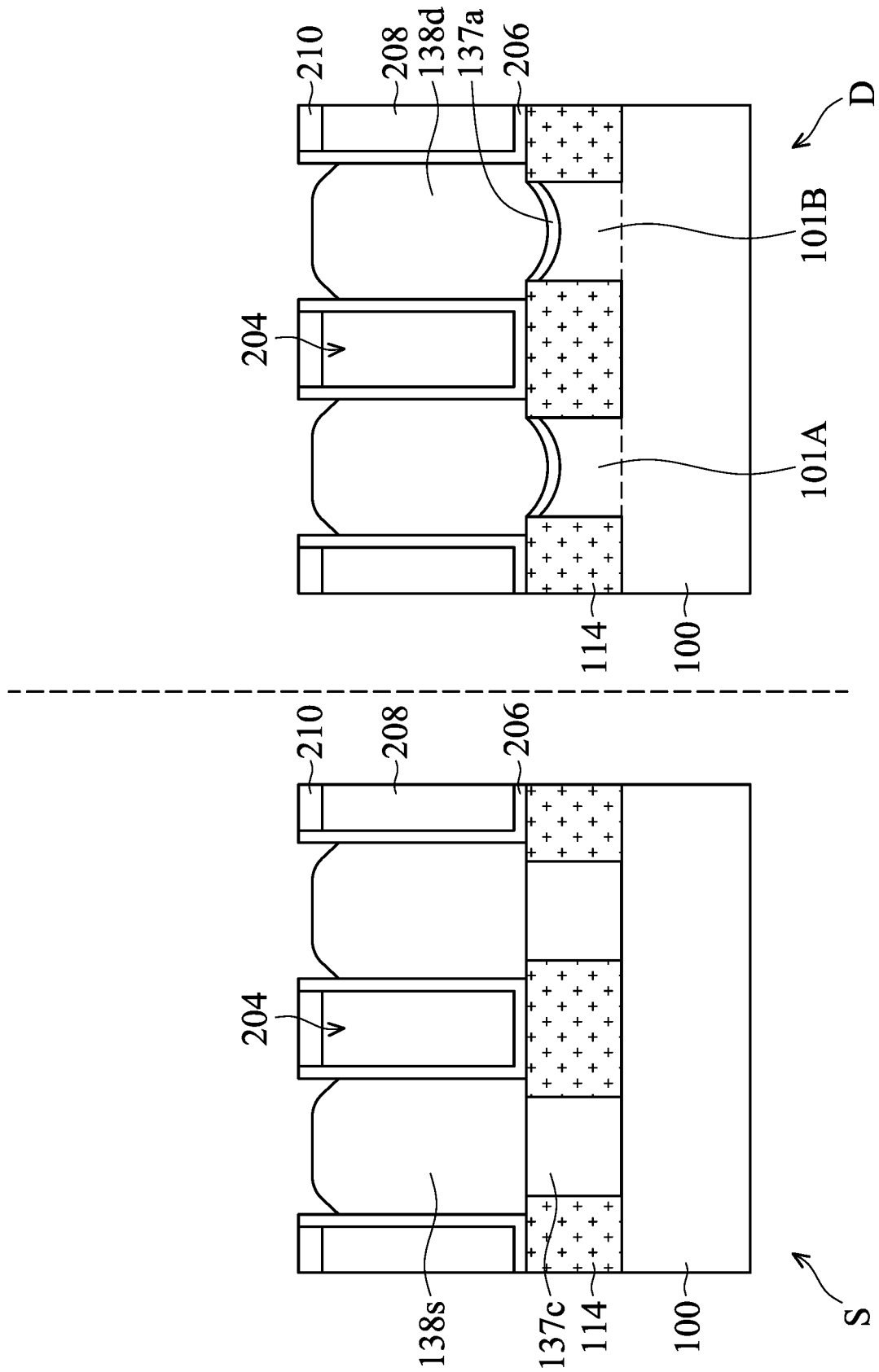

As shown in FIG. 3H, epitaxial structures 138s and 138d are formed beside the dummy gate stacks 120A and 120B, in accordance with some embodiments. In some embodiments, the epitaxial structures 138s and 138d fill the recesses 130, as shown in FIGS. 3H and 4D. In some other embodiments, the epitaxial structures 138s and 138d overfill the recesses 130. In these cases, the top surfaces of the epitaxial structures 138s and 138d may be higher than the top surface of the dummy gate dielectric layer 116. In some other embodiments, the epitaxial structures 138s and 138d partially fill the recesses 130. As shown in FIG. 4D, the dielectric fins 204 may be used to prevent the nearby epitaxial structures 138s or the nearby epitaxial structures 138d from being merged together. In some embodiments, the epitaxial structures 138s are in direct contact with the dielectric fins 204, as shown in FIG. 4D. In some embodiments, the height of each of the epitaxial structures 138s is greater than the height of the isolation structure 114.

In some embodiments, the epitaxial structures 138s and 138d connect to the semiconductor layers 104a-104d. Each of the semiconductor layers 104a-104d is sandwiched between the epitaxial structures 138s and 138d. In some embodiments, the epitaxial structures 138s function as source structures, and the epitaxial structures 138d function as drain structures. In some embodiments, some of the epitaxial structures 138s and 138d are p-type doped regions. The epitaxial structures 138s and 138d may include epitaxially grown silicon germanium (SiGe), epitaxially grown silicon, or another suitable epitaxially grown semiconductor material.

However, embodiments of the disclosure are not limited thereto. In some other embodiments, some of the epitaxial structures 138s and 138d are n-type doped regions. The epitaxial structures 138s and 138d may include epitaxially grown silicon, epitaxially grown silicon carbide (SiC), epitaxially grown germanium, or another suitable epitaxially grown semiconductor material.

In some embodiments, each of the epitaxial structures 138d includes a first portion 137a and second portions 137b.

The first portion 137a is positioned at the bottom portion of the epitaxial structure 138d. Each of the epitaxial structures 138s includes a bottom portion 137c and second portions 137b. The bottom portion 137c is positioned at the bottom portion of the epitaxial structure 138s. The bottom portion 137c may fill the extended portion of the recess 130. The bottom portion 137c may be surrounded by the isolation structure 114, as shown in FIG. 4D. The bottom portion 137c may function as a dummy epitaxial structure and will be removed later.

The second portions 137b are positioned adjacent to the semiconductor layer 104b, 104c, or 104d. The first portion 137a and the second portions 137b may have different compositions than other portions of the epitaxial structure 138s or 138d. In some embodiments, the first portion 137a, the second portions 137b, and the bottom portion 137c have a lower dopant concentration than the other portions of the epitaxial structure 138s or 138d. In some embodiments, the first portion 137a or the bottom portion 137c is substantially free of dopant. The first portion 137a may be used to prevent or reduce current leakage from the epitaxial structures 138s and 138d. In some embodiments, the first portion 137a and the second portions 137b have a lower atomic concentration of germanium than the other portions of the epitaxial structure 138s or 138d.

In some embodiments, the epitaxial structures 138s and 138d are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138s and 138d involve one or more etching processes.

In some embodiments, the epitaxial structures 138s and 138d are doped with one or more suitable p-type dopants. For example, the epitaxial structures 138s and 138d are SiGe source/drain features or Si source/drain features that are doped with boron (B), gallium (Ga), indium (In), or another suitable dopant. In some other embodiments, the epitaxial structures 138 are doped with one or more suitable n-type dopants. For example, the epitaxial structures 138s and 138d are Si source/drain features doped with phosphor (P), antimony (Sb), or another suitable dopant.

In some embodiments, the epitaxial structures 138s and 138d are doped in-situ during their epitaxial growth. The initial reaction gas mixture for forming the epitaxial structures 138s and 138d contains dopants. In some other embodiments, the epitaxial structures 138s and 138d are not doped during the growth of the epitaxial structures 138s and 138d. Instead, after the formation of the epitaxial structures 138s and 138d, the epitaxial structures 138s and 138d are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138s and 138d are further exposed to one or more annealing processes to activate the dopants. For example, a rapid thermal annealing process is used.

Figure 3I:
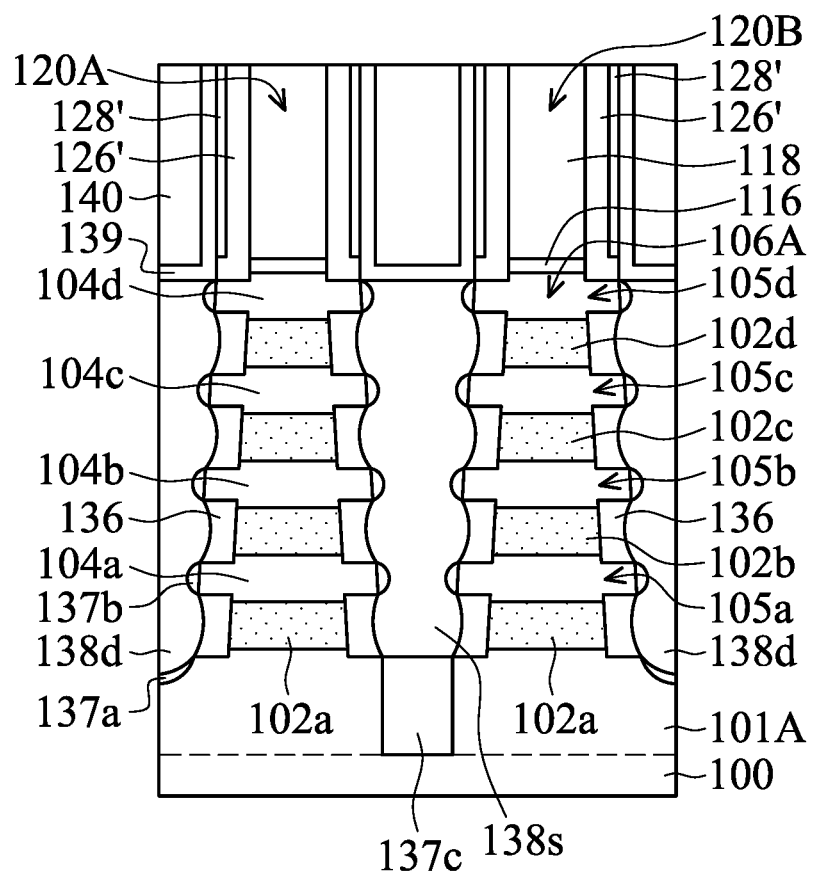

As shown in FIG. 3I, a contact etch stop layer 139 and a dielectric layer 140 are formed to cover the epitaxial structures 138s and 138d, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3H. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figure 2H:
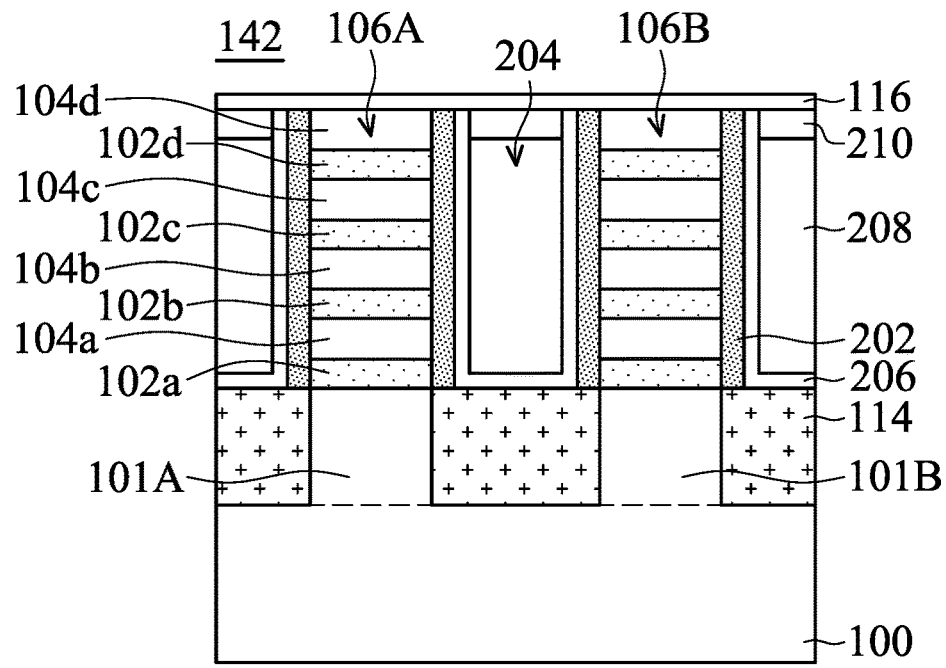
Figure 3J:
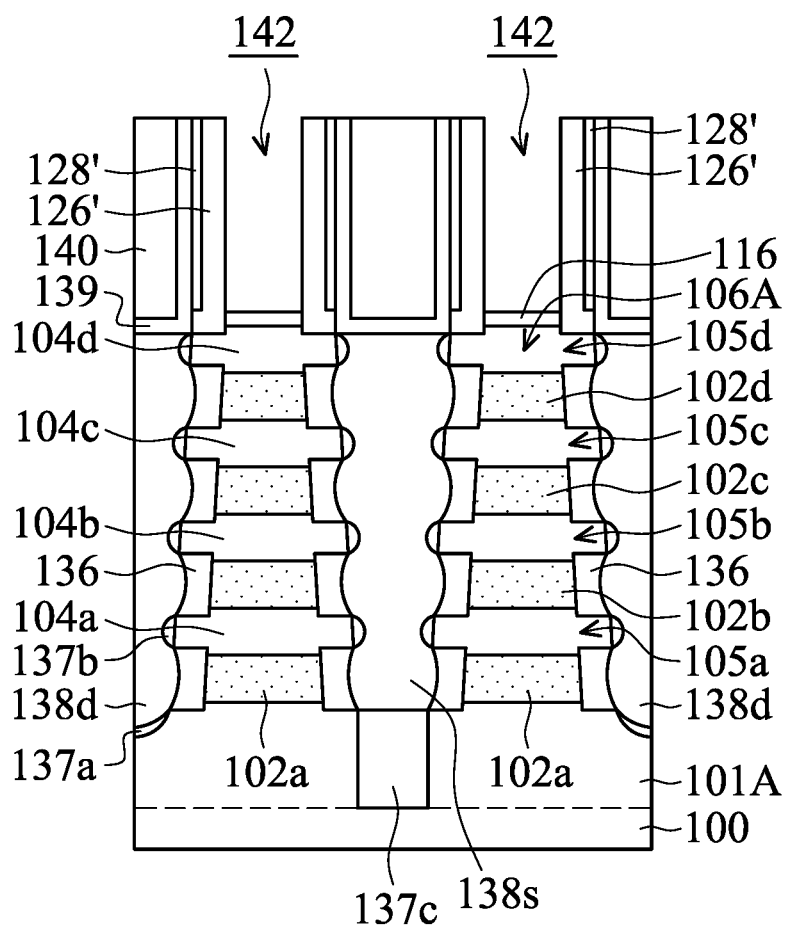

As shown in FIGS. 2H and 3J, one or more etching processes are used to remove the dummy gate electrodes 118, in accordance with some embodiments. As a result, trenches 142 are formed. The trenches 142 are surrounded by the dielectric layer 140. The trenches 142 expose the dummy gate dielectric layer 116.

Figure 2I:
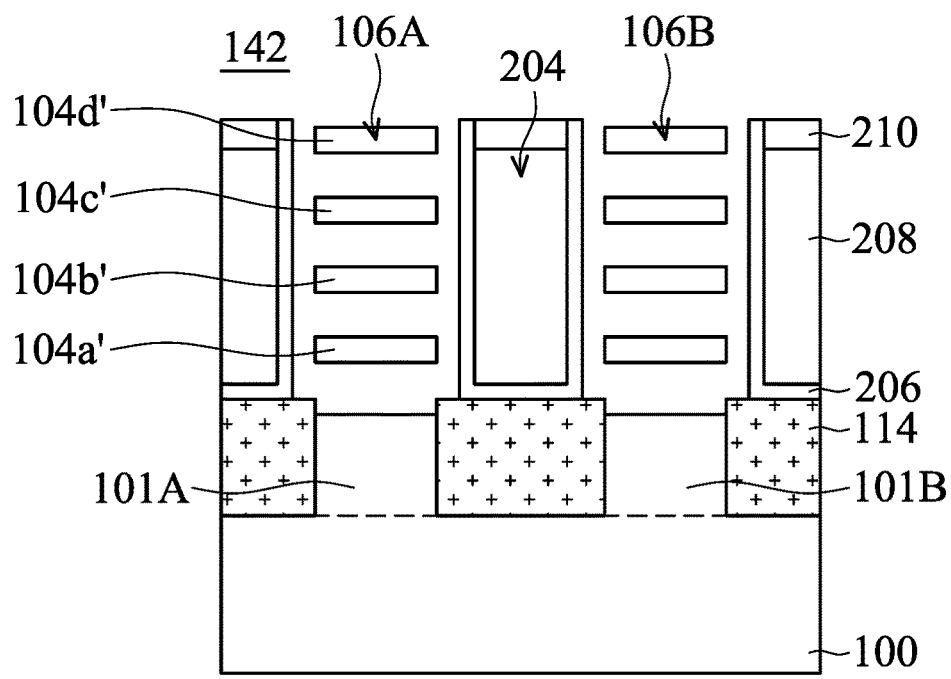
Figure 3K:
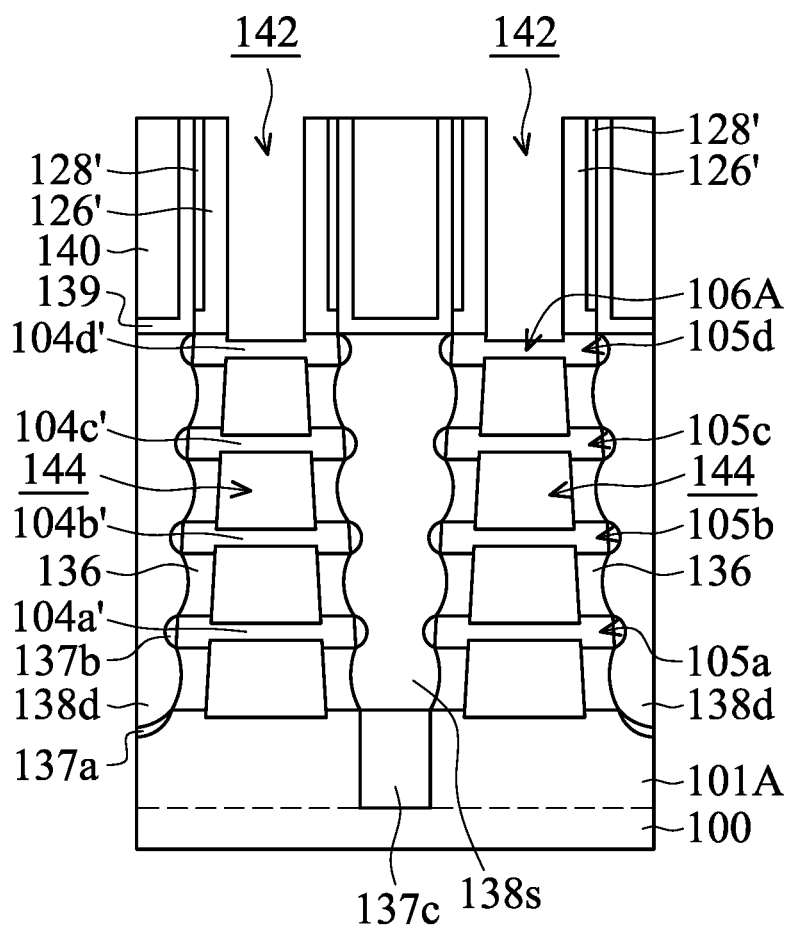

As shown in FIGS. 2I and 3K, the dummy gate dielectric layer 116, the semiconductor layers 102a-102d (that function as sacrificial layers), and the sacrificial spacers 202 are removed, in accordance with some embodiments. In some embodiments, an etching process is used to remove the semiconductor layers 102a-102d and the sacrificial spacers 202. As a result, recesses 144 are formed, as shown in FIGS. 2I and 3K.

Due to high etching selectivity, the semiconductor layers 104a-104d are slightly (or substantially not) etched. The remaining portions of the semiconductor layers 104a-104d form multiple semiconductor nanostructures 104a'-104d' of the fin structures 106A and 106B, as shown in FIGS. 2I and 3K. The semiconductor nanostructures 104a'-104d' are constructed by or made up of the remaining portions of the semiconductor layers 104a-104d. The semiconductor nanostructures 104a'-104d' suspended over the semiconductor fin 101A or 101B may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than each of the edge portions 105b-105d since the edge portions 105b-105d are surrounded by other elements and thus are prevented from being reached and etched by the etchant.

However, embodiments of the disclosure are not limited thereto. In some other embodiments, each of the semiconductor nanostructures 104a'-104d' is substantially as thick as each of the edge portions 105b-105d. In some other embodiments, each of the semiconductor nanostructures 104a'-104d' is thicker than each of the edge portions 105b-105d.

After the removal of the semiconductor layers 102a-102d (that function as sacrificial layers), the recesses 144 are formed. The recesses 144 connect to the trench 142 and surround each of the semiconductor nanostructures 104a'-104d'. As shown in FIGS. 2I and 3K, even if the recesses 144 between the semiconductor nanostructures 104a'-104d' are formed, the semiconductor nanostructures 104a'-104d' remain held by the epitaxial structures 138s and 138d (see FIG. 3K). Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138s and 138d from being etched or damaged. The quality and reliability of the semiconductor device structure are improved.

Figure 2J:
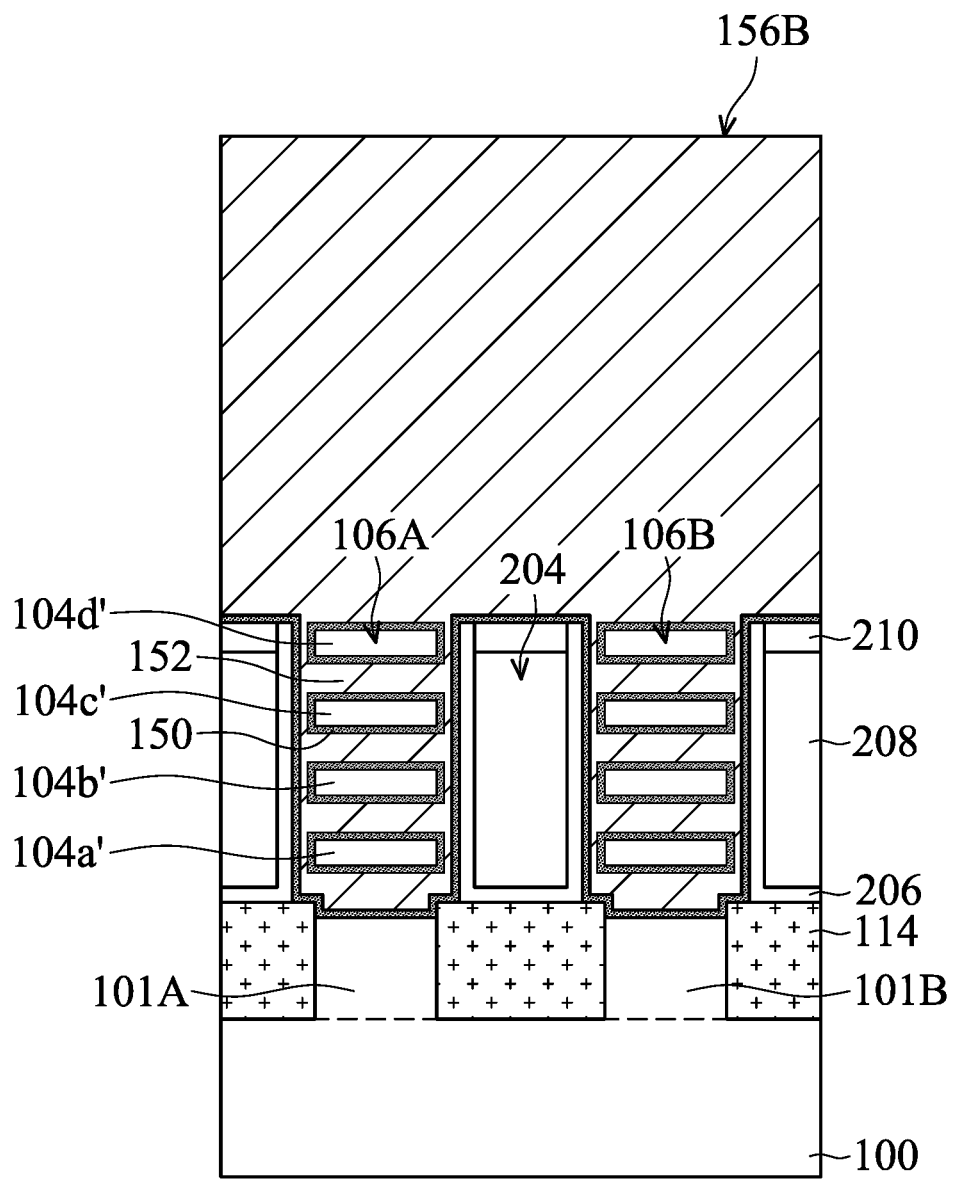
Figure 3L:
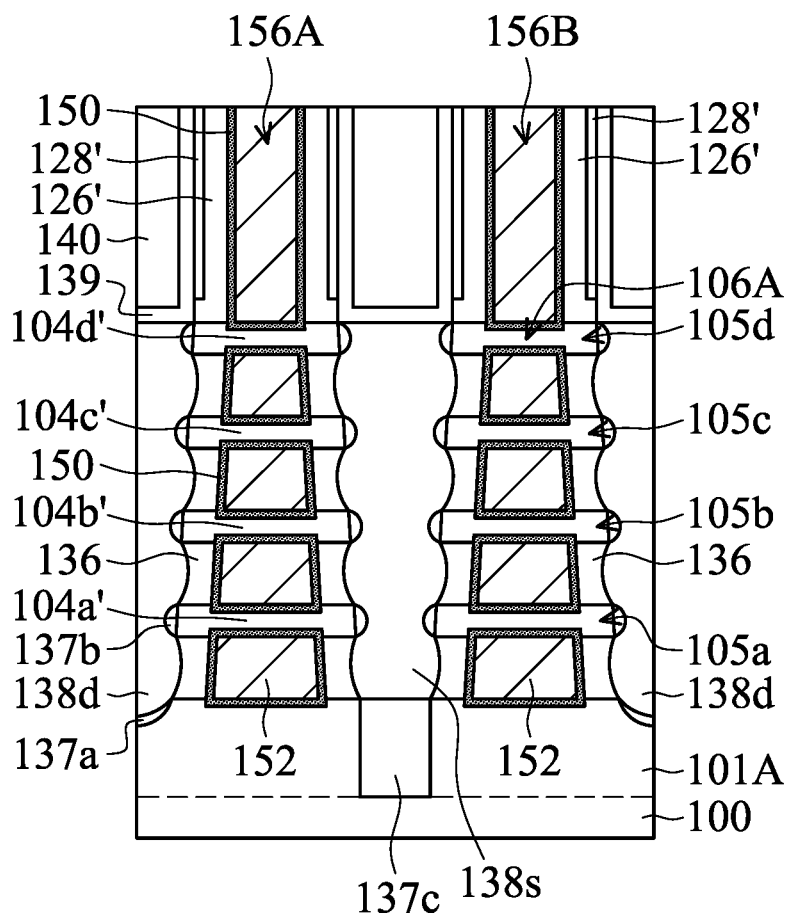

As shown in FIGS. 2J and 3L, metal gate stacks 156A and 156B are formed to fill the trenches 142, in accordance with some embodiments. The metal gate stacks 156A and 156B extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIGS. 2J and 3L. A portion of the metal gate stack 156B is between the semiconductor nanostructures 104a'-104d' and the dielectric fins 204, as shown in FIG. 2J.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Figure 3M:
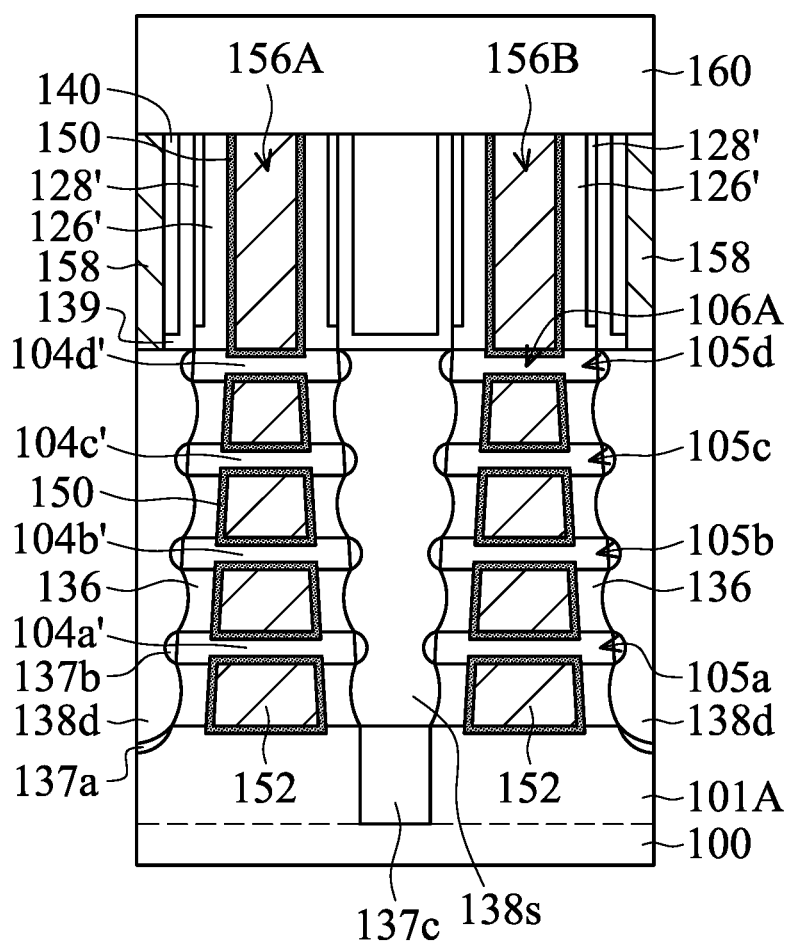

As shown in FIG. 3M, frontside conductive contacts 158 and an interconnection structure 160 are formed, in accordance with some embodiments. In some embodiments, each of the frontside conductive contacts is electrically connected to one of the epitaxial structures 138d. In some embodiments, no frontside conductive contact is formed to be in electrical contact with the epitaxial structure 138s. A backside conductive contact will be formed later to be in electrical contact with the epitaxial structure 138s. Therefore, the metal layer routing is significantly relaxed.

The formation of the frontside conductive contacts 158 may involve one or more patterning processes for forming contact openings, one or more deposition processes for forming conductive materials into the conductive openings, and one or more planarization processes to accomplish the formation of the frontside conductive contacts 158. The frontside conductive contacts 158 may be made of or include Co, Ru, W, Ti, TiN, Ta, TaN, Mo, Ni, Cu, Au, one or more other suitable materials, or a combination thereof.

In some embodiments, a metal-semiconductor compound layer (not shown) is formed between the frontside conductive contact 158 and the epitaxial structure 138d. The metal-semiconductor compound layer may be a metal silicide material that contains titanium, nickel, cobalt, tantalum, platinum, tungsten, one or more other noble metals, one or more other refractory metals, one or more other rare earth metals, one or more other suitable materials, or a combination thereof. Alternatively, the metal-semiconductor compound layer may be a metal-containing material that contains no silicon. For example, the metal-semiconductor compound layer may contain germanium and a metal element such as titanium, nickel, cobalt, tantalum, platinum, tungsten, one or more other noble metals, one or more other refractory metals, one or more other rare earth metals, one or more other suitable materials, or a combination thereof.

The interconnection structure 160 may include middle-end-of line structures and back-end-of-line structures. The interconnection structure 160 may include multiple dielectric layers, multiple conductive contacts, multiple conductive lines, and multiple conductive vias. The interconnection structure 160 may include four to five metal lines that are vertically stacked. The formation of the interconnection structure 160 may involve multiple deposition processes, multiple patterning processes, and multiple planarization processes.

Figure 3N:
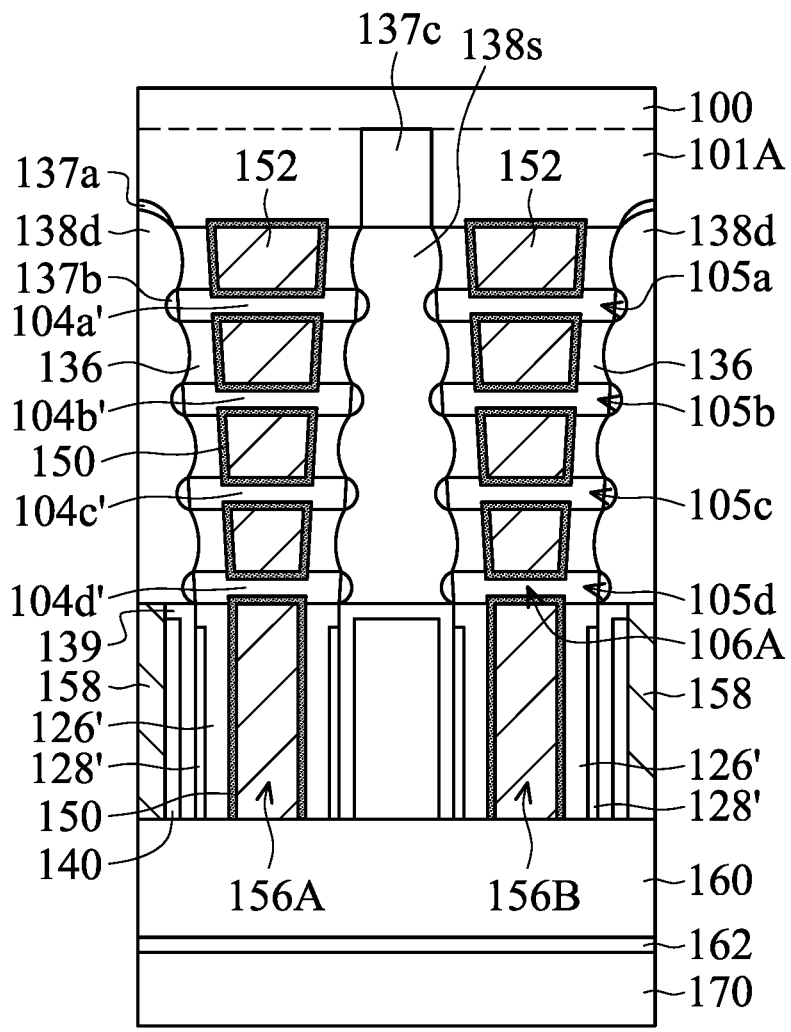

As shown in FIG. 3N, a carrier substrate 170 is bonded onto the interconnection structure 160, in accordance with some embodiments. The carrier substrate 170 may be a semiconductor wafer such as a silicon wafer, a silicon-on-insulator (SOI) wafer, or a glass wafer. An adhesion layer 162 may be formed to achieve the bonding between the carrier substrate 170 and the interconnection structure 160. After bonding with the carrier substrate 170, the structure is flipped upside down such that the backside surface of the semiconductor substrate 100 faces upwards, as shown in FIG. 3N.

Figure 3O:
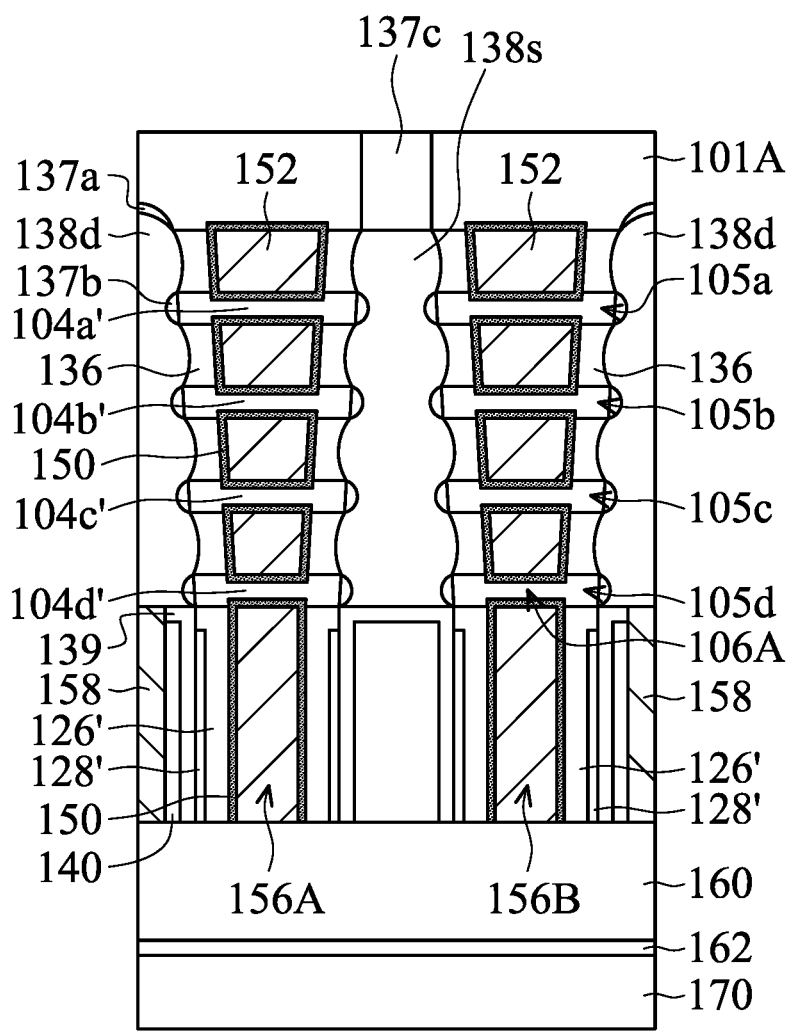

As shown in FIG. 3O, a thinning process is then used to thin down the semiconductor substrate 100, in accordance with some embodiments. In some embodiments, after the thinning process, the semiconductor substrate 100 is removed such that the semiconductor fin 101A and the isolation structure 114 are exposed. In some embodiments, the bottom portion 137c (that functions as a dummy epitaxial structure) is also exposed, as shown in FIG. 3O. The thinning process may include a CMP process, a grinding process, a dry polishing process, an etching process, one or more other applicable processes, or a combination thereof.

Figure 3P:
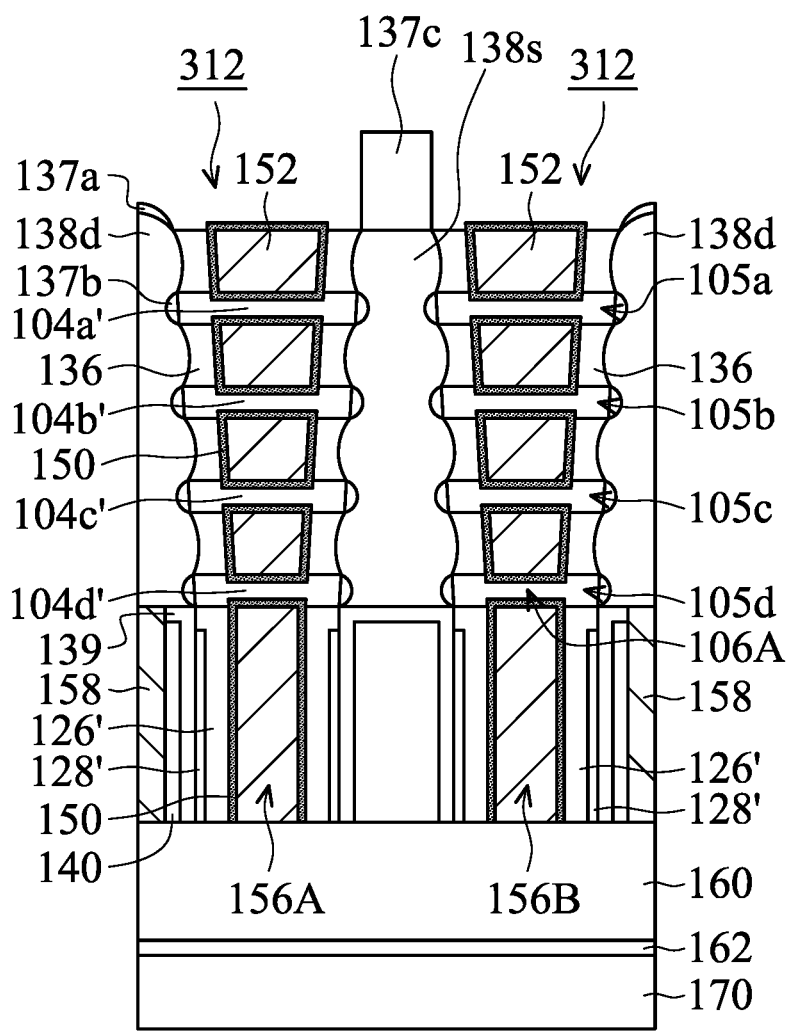

As shown in FIG. 3P, with the bottom portion 137c (that functions as a dummy epitaxial structure) as an etching mask, one or more etching processes are used to partially remove the semiconductor fins (such as the semiconductor fin 101A), in accordance with some embodiments. As a result, openings 312 that expose the epitaxial structures 138d are formed.

Figure 3Q:
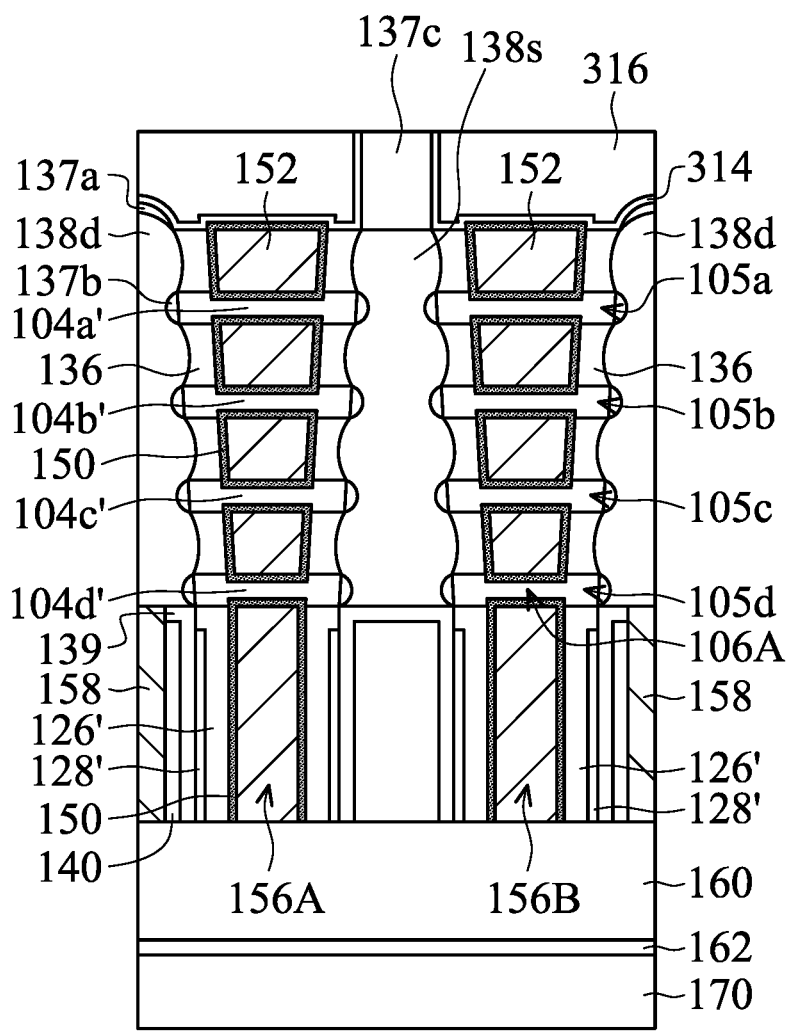
Figure 4E:
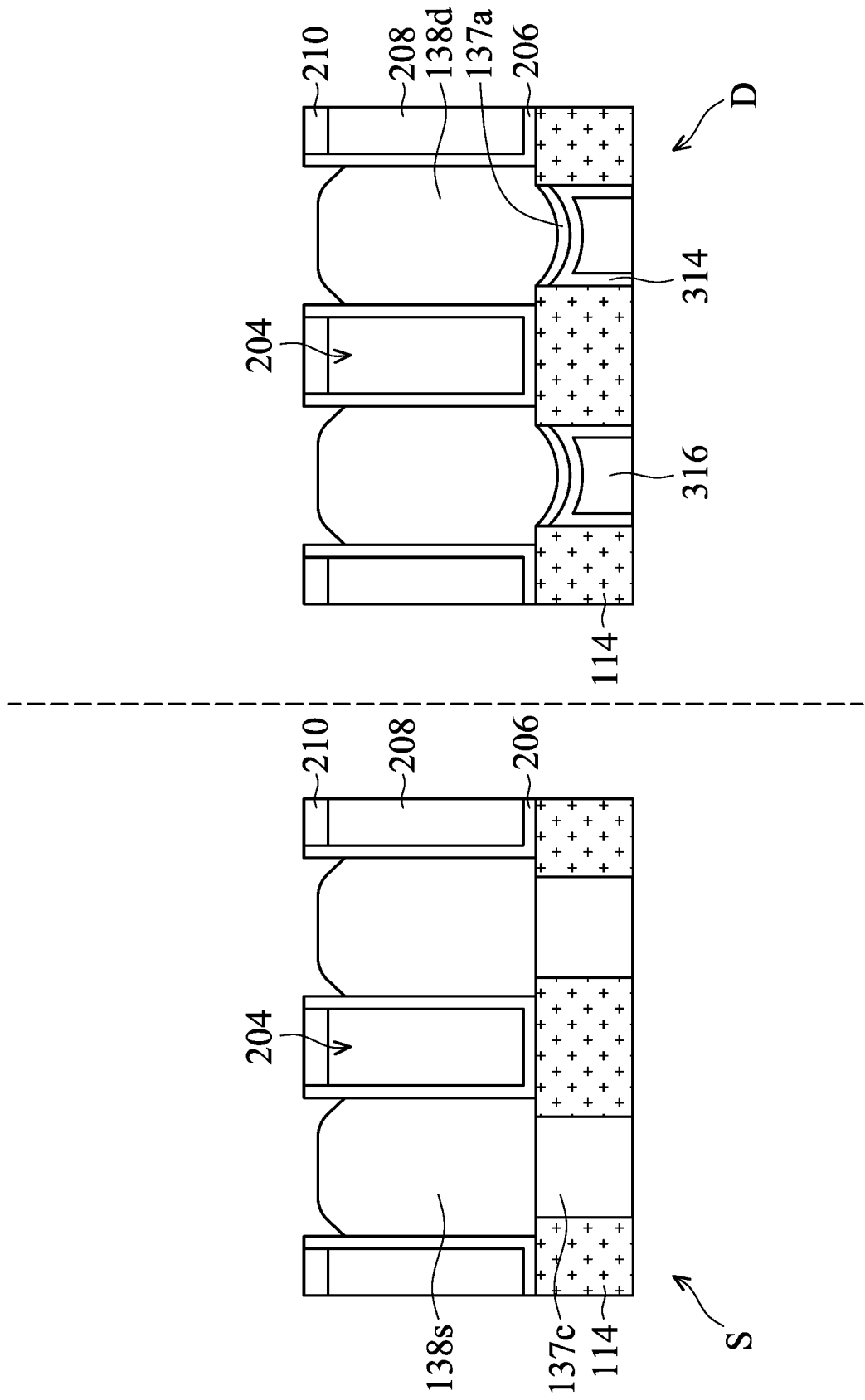

As shown in FIGS. 3Q and 4E, etch stop elements 314 and dielectric fillings 316 are formed in the openings 312, in accordance with some embodiments. The etch stop elements 314 extend along sidewalls of the bottom portion 137c (that functions as a dummy epitaxial structure), sidewalls of the isolation structures 114 in the second region D, and bottoms of the epitaxial structures 138d. The dielectric fillings 316 may fill the remaining space of the openings 312. In some embodiments, because the isolation structure 114 is formed to have a low height, each of the openings 312 has a low aspect ratio, which facilitates the formation of the etch stop elements 314 and the dielectric fillings 316 in the openings 312. For example, voids are prevented from being formed in the dielectric fillings 316. The reliability and quality of the dielectric fillings 316 are improved.

Each of the dielectric fillings 316 may be a single layer structure. Alternatively, each of the dielectric fillings 316 may be a multilayer structure that includes multiple sub-layers. Some of the sub-layers may be made of different materials. The etch stop elements 314 and the dielectric fillings 316 may be used to significantly prevent short circuiting between the backside conductive contact (that will be formed later) and other conductive elements such as a nearby backside conductive contact or a nearby drain structure.

The etch stop elements 314 may be made of or include silicon nitride, silicon oxynitride, silicon carbide, aluminum oxide, one or more other suitable materials, or a combination thereof. The dielectric fillings 316 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited to overfill the openings 312. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to remove the etch stop material layer and the dielectric material layer outside of the openings 312. As a result, the remaining portions of the etch stop material layer and the dielectric material layer form the etch stop elements 314 and the dielectric fillings 316, respectively. The planarization process may include a CMP process, a grinding process, an etching process, a dry polishing process, one or more other applicable processes, or a combination thereof. In some embodiments, after the planarization process, the surfaces of the etch stop elements 314, the dielectric fillings 316, and the bottom portion 137c (that functions as a dummy epitaxial structure) are substantially level with each other.

Figure 3R:
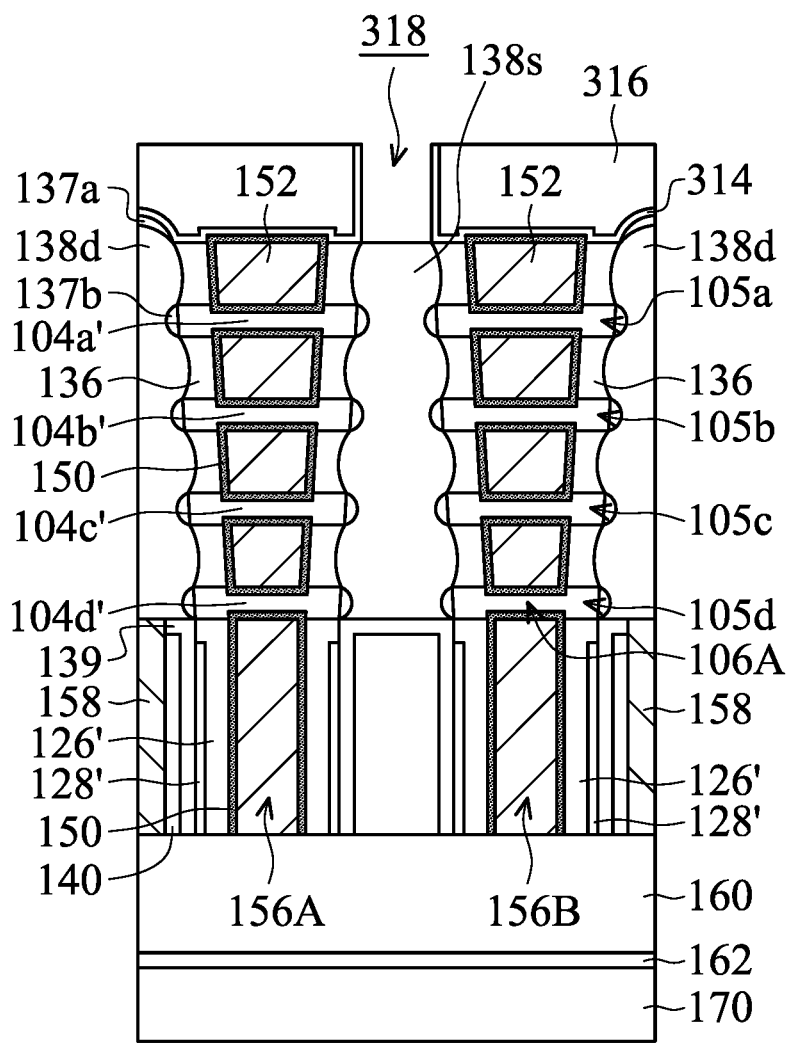

As shown in FIG. 3R, with the etch stop elements 314, the dielectric fillings 316, and the isolation structure 114 as a self-align etching mask, one or more etching processes are used to remove the bottom portion 137c (that functions as a dummy epitaxial structure), in accordance with some embodiments. As a result, a backside contact opening 318 that exposes the remaining epitaxial structures 138s are formed. In some embodiments, no photolithography process is used for forming the backside contact opening 318.

Figure 3S:
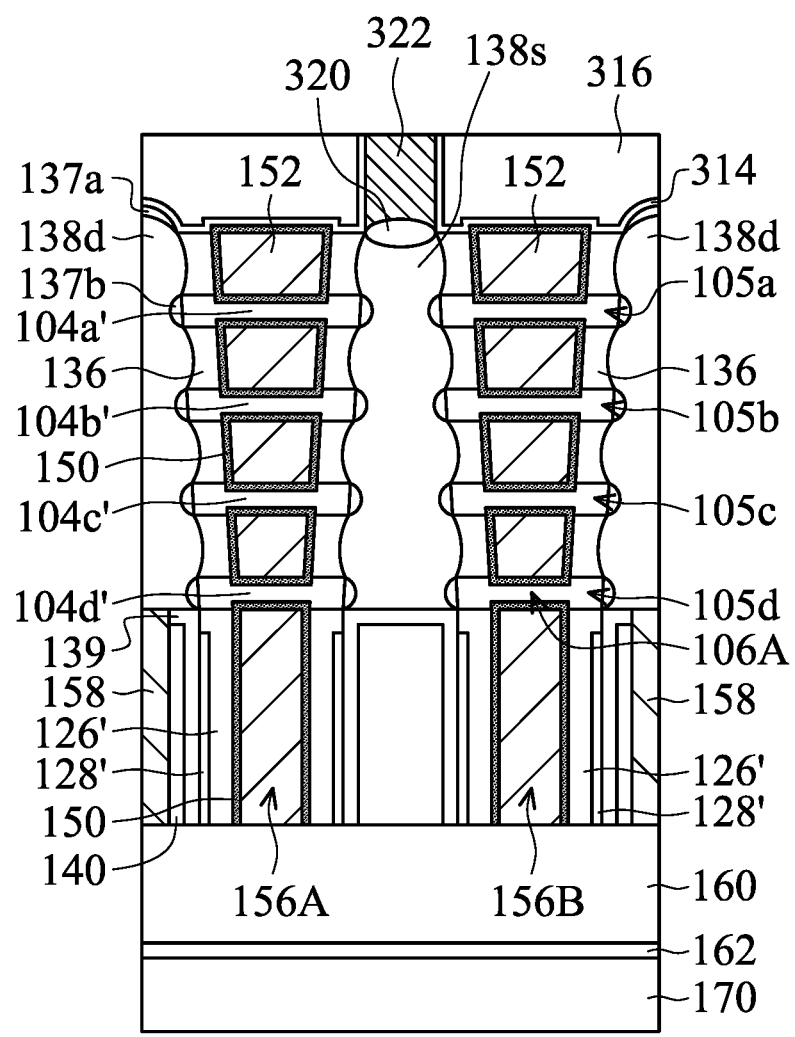
Figure 3T:
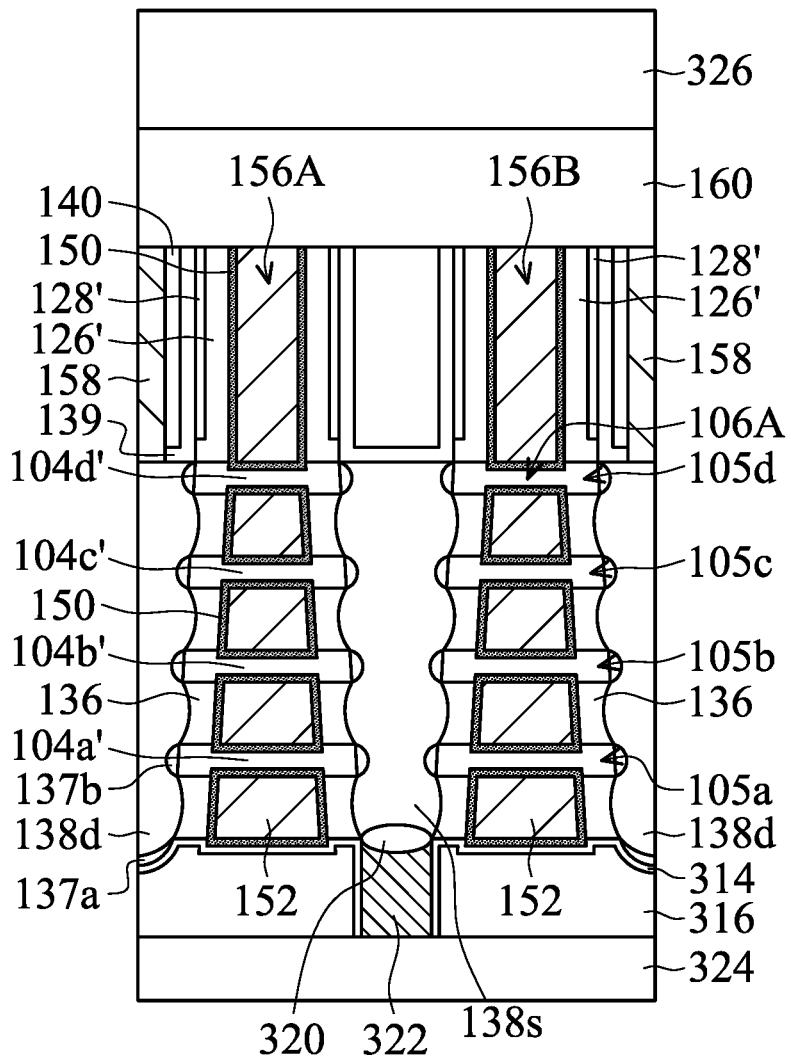
Figure 4F:
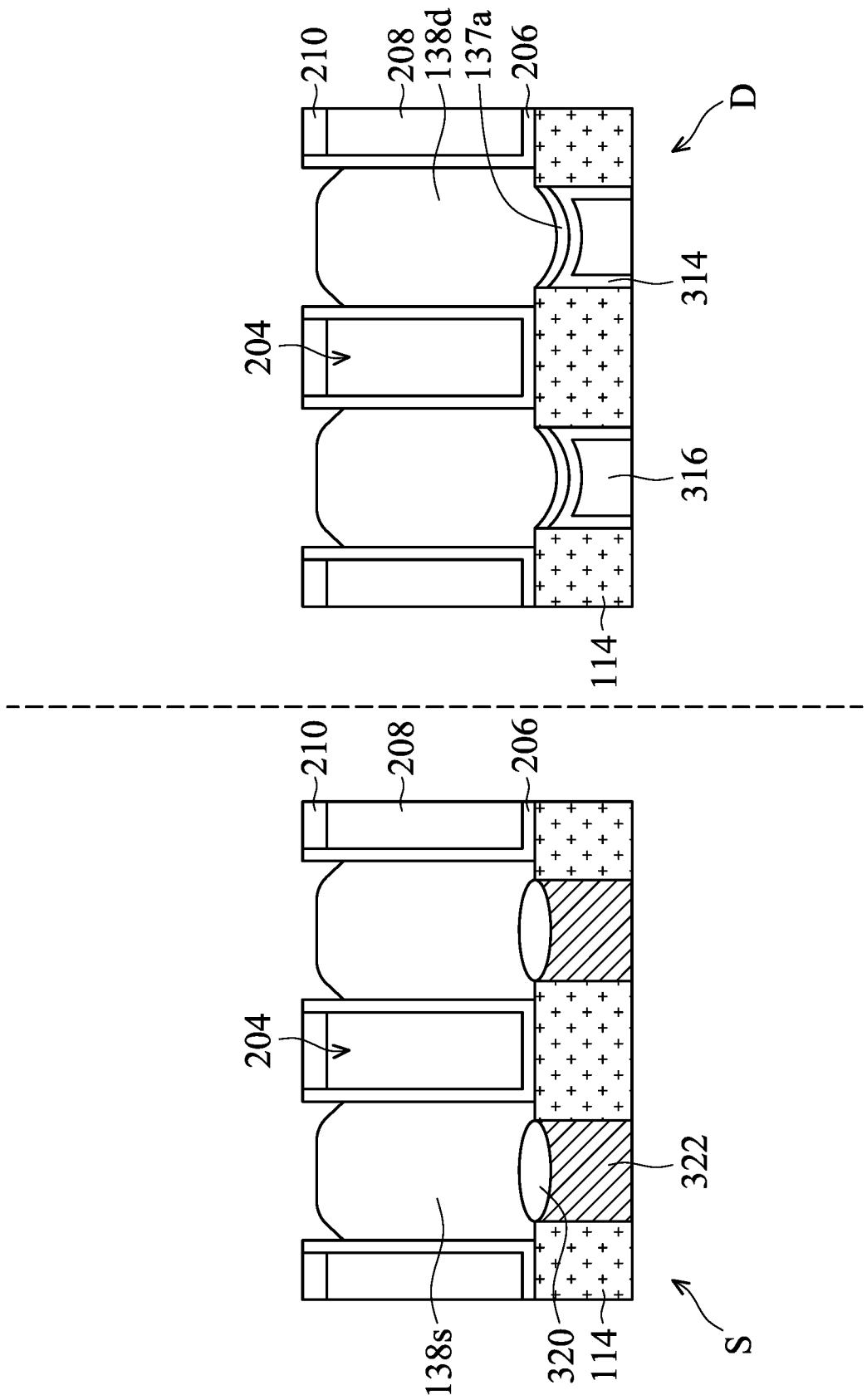

As shown in FIGS. 3S and 4F, backside conductive contacts 322 are formed into the backside contact opening 318, in accordance with some embodiments. In some embodiments, because the isolation structure 114 is formed to have a low height, each of the backside contact openings 318 has a low aspect ratio, which facilitates the formation of the backside conductive contacts 322 in the backside contact opening 318. For example, voids are prevented from being formed in the backside contact openings 318. The reliability and conductivity of the backside contact openings 318 are improved.

Each of the backside conductive contacts 322 is electrically connected to the respective epitaxial structure 138s. Each of the backside conductive contacts 322 may function as a portion of a power rail connected to the respective epitaxial structure 138s. In some embodiments, each of the epitaxial structures 138s is wider than each of the backside conductive contacts 322, as shown in FIGS. 3S and 4F.

In some embodiments, the etch stop element 314 extends along a first sidewall of the backside conductive contact 322 and the bottom of the metal gate stack 156A or 156B, as shown in FIG. 3S. In some embodiments, the etch stop element 314 is in direct contact with the first sidewall of the backside conductive contact 322. In some embodiments, the isolation structure 114 is in direct contact with a second sidewall of the backside conductive contact 322, as shown in FIG. 4F.

In some embodiments, before the formation of the backside conductive contact 322, metal-semiconductor compound layers 320 are formed on the bottom surface of the epitaxial structures 138s that are exposed by the backside contact openings 318. Each of the metal-semiconductor compound layers 320 may be a metal silicide material that contains titanium, nickel, cobalt, tantalum, platinum, tungsten, one or more other noble metals, one or more other refractory metals, one or more other rare earth metals, one or more other suitable materials, or a combination thereof. Alternatively, the metal-semiconductor compound layer may be a metal-containing material that contains no silicon. For example, the metal-semiconductor compound layer may contain germanium and a metal element such as titanium, nickel, cobalt, tantalum, platinum, tungsten, one or more other noble metals, one or more other refractory metals, one or more other rare earth metals, one or more other suitable materials, or a combination thereof.

In some embodiments, before the formation of the metal-semiconductor compound layer 320, the exposed epitaxial structures 138s are modified to assist in the subsequent formation of the metal-semiconductor compound layers 320. In some embodiments, one or more ion implantation processes are used to reduce the crystallinity of the surface portion of the epitaxial structures 138s, which allows a subsequently deposited metal material to react with the modified surface portions more easily. The formation of the metal-semiconductor compound layers 320 may thus be facilitated.

In some embodiments, the implantation process is a plasma doping process. Plasma may be introduced into the backside contact openings 318 to modify the exposed surface portions of the epitaxial structures 138s. In some embodiments, reaction gas used in the implantation process includes silicon-containing gas, germanium-containing gas, argon-containing gas, helium-containing gas, one or more other suitable gases, or a combination thereof.

In some embodiments, a metal-containing material is applied (or deposited) on the epitaxial structures 138s while the epitaxial structures 138s are heated, in accordance with some embodiments. In some embodiments, the metal-containing material is applied (or deposited) using a CVD process, an ALD process, a PVD process, one or more other applicable processes, or a combination thereof. Because the metal-containing material is applied during the heating of the epitaxial structure 138s, the thermal energy may help to initiate chemical reaction between the surface portions of the epitaxial structure 138s and the metal-containing material. As a result, the surface portions of the epitaxial structure 138s react with the metal-containing material, and they are transformed into the metal-semiconductor compound layer 320.

As mentioned above, the metal-containing material is applied (or deposited) on the epitaxial structures 138s while the epitaxial structures 138s are heated. In some embodiments, the epitaxial structure 138s is heated to a temperature that is in a range from about 390 degrees C. to about 440 degrees C. In some embodiments, before the metal-containing material is applied (or deposited) on the epitaxial structures 138s, the epitaxial structures 138s are heated to be at a raised temperature. Afterwards, the epitaxial structures 138s are kept at the raised temperature while the metal-containing material is applied (or deposited). The raised temperature may be in a range from about 390 degrees C. to about 440 degrees C.

Many variations and/or modifications can be made to embodiments of the disclosure. In some other embodiments, the metal-containing material is applied (or deposited) on the epitaxial structure 138s without heating the epitaxial structure 138s at the same time. A subsequent thermal operation is then used to form the metal-semiconductor compound layer 320.

In some embodiments, the metal-containing material is also applied (or deposited) on sidewalls of the backside contact opening 318 and the top surface of the dielectric fillings 316, so as to form a metal layer. Afterwards, an etching process may be used to remove the metal layer that does not react with the epitaxial structures 138s.

However, embodiments of the disclosure are not limited thereto. Many variations and/or modifications can be made to embodiments of the disclosure. In some other embodiments, the metal-semiconductor compound layer 320 is not formed.

After the formation of the metal-semiconductor compound layer 320, a conductive material is deposited to overfill the backside contact opening 318, in accordance with some embodiments. The conductive material may be made of or include ruthenium, cobalt, tungsten, titanium, molybdenum, tantalum, nickel, copper, titanium nitride, tantalum nitride, one or more other suitable materials, or a combination thereof. The conductive material may be deposited using an ALD process, a CVD process, a PVD process, an electroplating process, an electroless plating process, one or more other applicable processes, or a combination thereof.

Afterwards, a planarization process is used to remove the conductive material outside of the backside contact opening 318, in accordance with some embodiments. As a result, the remaining portions of the conductive material in the backside contact openings 318 form the backside conductive contacts 322. The planarization process mentioned above may include a CMP process, a grinding process, an etching process, a dry polishing process, one or more other applicable processes, or a combination thereof.

As mentioned above, in some embodiments, the height ratio ($H_2/H_1$) of the height $H_2$ of the dielectric fin 204 to the height $H_1$ of the isolation structure 114 is in a range from about 0.75 to about 1.8. In some cases, if the height ratio ($H_2/H_1$) is smaller than about 0.75, the height $H_1$ of the isolation structure 114 may be too high, which leads to a high aspect ratio of the opening 312 or the backside contact opening 318. The formation and quality of the dielectric filling 316 and the backside conductive contact 322 might be negatively affected. In some cases, if the height ratio ($H_2/H_1$) is greater than about 1.8, the height $H_1$ of the isolation structure 114 may be too small. The isolation structure 114 might not be able to prevent current leakage between elements such as between nearby epitaxial structures.

As shown in FIG. 3T, an interconnection structure 324 is formed over the dielectric fillings 316 and the backside conductive contact 322, in accordance with some embodiments. Similar to the interconnection structure 160, the interconnection structure 324 includes multiple dielectric layers and multiple conductive features including conductive lines and conductive vias. One of the conductive lines may be in electrically connected to the backside conductive contact 322, and they may together function as a power rail.

Afterwards, the device structure is flipped upside down, and the carrier substrate 170 and the adhesion layer 162 are removed. Afterwards, an interconnection structure 326 is formed over the interconnection structure 160, as shown in FIG. 3T in accordance with some embodiments.

In some embodiments, there are four channel structures (such as the semiconductor nanostructures 104a'-104d') formed. However, embodiments of the disclosure are not limited thereto. Many variations and/or modifications can be made to embodiments of the disclosure. In some embodiments, the total number of semiconductor nanostructures is greater than four. In some other embodiments, the total number of semiconductor nanostructures is smaller than four. The total number of semiconductor nanostructures (or channel structures) of each semiconductor device structure may be fine-tuned to meet requirements. For example, the total number of semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with a backside conductive contact and a fin structure. A stack of channel structures of the fin structures are wrapped in a metal gate stack. The isolation structure (such as a STI structure) is formed to have a low height, which enables a subsequently formed backside contact opening to have a low aspect ratio to facilitate the formation of the backside conductive contact. The reliability and quality of the semiconductor device structure are greatly improved.

In accordance with some embodiments, a semiconductor device structure is provided. The semiconductor device structure includes a stack of channel structures and includes a first epitaxial structure and a second epitaxial structure adjacent to opposite sides of the channel structures. The semiconductor device structure also includes a gate stack wrapped around each of the channel structures and a backside conductive contact connected to the second epitaxial structure. The second epitaxial structure is between a top of the backside conductive contact and a top of the gate stack. The semiconductor device structure further includes a dielectric fin stacked over an isolation structure. The dielectric fin is adjacent to the second epitaxial structure, and the isolation structure is adjacent to the backside conductive contact. The isolation structure has a first height, the dielectric fin has a second height, and the second height is greater than the first height.

In accordance with some embodiments, a semiconductor device structure is provided. The semiconductor device structure includes a stack of channel structures and includes a first epitaxial structure and a second epitaxial structure sandwiching the channel structures. The semiconductor device structure also includes a gate stack wrapped around the channel structures and a backside conductive contact connected to the second epitaxial structure. The backside conductive contact is below a bottom surface of the second epitaxial structure. The semiconductor device structure further includes a dielectric fin stacked over an isolation structure. The dielectric fin is adjacent to the second epitaxial structure, and the isolation structure is adjacent to the backside conductive contact. The isolation structure has a first height, the dielectric fin has a second height, and a ratio of the second height to the first height is in a range from about 0.75 to about 1.8.

In accordance with some embodiments, method for forming a semiconductor device structure is provided. The method includes forming a fin structure over a semiconductor substrate, and the fin structure has a plurality of sacrificial layers and a plurality of semiconductor layers laid out alternately. The method also includes surrounding a lower portion of the fin structure with an isolation structure. A protruding portion of the fin structure above a top of the isolation structure has a first height that is greater than a second height of the isolation structure. The method further includes forming a first epitaxial structure and a second epitaxial structure sandwiching the fin structure. In addition, the method includes removing the sacrificial layers to release a plurality of semiconductor nanostructures made of remaining portions of the semiconductor layers. The method includes forming a gate stack to wrap around the semiconductor nanostructures. The method also includes forming a backside conductive contact connected to the second epitaxial structure. The backside conductive contact is adjacent to the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a stack of channel structures;
a first epitaxial structure and a second epitaxial structure adjacent to opposite sides of the channel structures;
a gate stack wrapped around each of the channel structures;
a backside conductive contact connected to the second epitaxial structure, wherein the second epitaxial structure is between a top of the backside conductive contact and a top of the gate stack;
a nitride layer extending along a sidewall of the backside conductive contact and a bottom of the gate stack; and
a dielectric fin stacked over an isolation structure, wherein the dielectric fin is adjacent to the second epitaxial structure, and the isolation structure is adjacent to the backside conductive contact.

2. The semiconductor device structure as claimed in claim 1, further comprising a metal-semiconductor compound layer between the backside conductive contact and the second epitaxial structure.

3. The semiconductor device structure as claimed in claim 1, further comprising a frontside conductive contact connected to the first epitaxial structure, wherein each of the channel structures is between the frontside conductive contact and the backside conductive contact.

4. The semiconductor device structure as claimed in claim 1, wherein the second epitaxial structure is wider than the backside conductive contact.

5. The semiconductor device structure as claimed in claim 1, wherein the second epitaxial structure is in direct contact with the dielectric fin.

6. The semiconductor device structure as claimed in claim 1, wherein the isolation structure has a first height, the dielectric fin has a second height, and a ratio of the second height to the first height is in a range from about 1.1 to about 1.8.

7. The semiconductor device structure as claimed in claim 1, wherein the isolation structure has a first height, the dielectric fin has a second height, the second epitaxial structure has a third height, and the third height is greater than the first height.

8. The semiconductor device structure as claimed in claim 1, wherein the isolation structure is in direct contact with a second sidewall of the backside conductive contact.

9. The semiconductor device structure as claimed in claim 1, wherein the isolation structure has a first height, the dielectric fin has a second height, and the second height is greater than the first height.

10. The semiconductor device structure as claimed in claim 1, wherein the second epitaxial structure continuously extends across top surfaces and bottom surfaces of the channel structures.

11. A semiconductor device structure, comprising:
a stack of channel structures;
a first epitaxial structure and a second epitaxial structure sandwiching the channel structures;
a gate stack wrapped around the channel structures;
a backside conductive contact connected to the second epitaxial structure, wherein the backside conductive contact is below a bottom surface of the second epitaxial structure; and
a dielectric fin stacked over an isolation structure, wherein the dielectric fin is adjacent to the second epitaxial structure, the isolation structure is adjacent to the backside conductive contact, the isolation structure has a first height, the dielectric fin has a second height, and a ratio of the second height to the first height is in a range from about 0.75 to about 1.8.

12. The semiconductor device structure as claimed in claim 11, wherein the ratio of the second height to the first height is in a range from about 1 to about 1.7.

13. The semiconductor device structure as claimed in claim 11, wherein the second epitaxial structure has a third height, and the third height is greater than the first height.

14. The semiconductor device structure as claimed in claim 11, wherein the backside conductive contact is in direct contact with the isolation structure.

15. The semiconductor device structure as claimed in claim 14, wherein the isolation structure is in direct contact with the dielectric fin.

16. A method for forming a semiconductor device structure, comprising:
forming a fin structure over a semiconductor substrate, wherein the fin structure has a plurality of sacrificial layers and a plurality of semiconductor layers laid out alternately;
surrounding a lower portion of the fin structure with an isolation structure, wherein a protruding portion of the fin structure above a top of the isolation structure has a first height that is greater than a second height of the isolation structure;
forming a first epitaxial structure and a second epitaxial structure sandwiching the fin structure;
removing the sacrificial layers to release a plurality of semiconductor nanostructures made of remaining portions of the semiconductor layers;
forming a gate stack to wrap around the semiconductor nanostructures;
removing a part of the lower portion of the fin structure to form an opening, wherein the opening is below the first epitaxial structure;
forming a dielectric filling in the opening; and
forming a backside conductive contact connected to the second epitaxial structure, wherein the backside conductive contact is adjacent to the isolation structure.

17. The method for forming a semiconductor device structure as claimed in claim 16, further comprising:
forming a dummy epitaxial structure, wherein the dummy epitaxial structure is between the second epitaxial structure and the semiconductor substrate, and the dummy epitaxial structure is surrounded by the isolation structure; and
removing the dummy epitaxial structure to expose the second epitaxial structure after the dielectric filling is formed.

18. The method for forming a semiconductor device structure as claimed in claim 17, further comprising thinning the semiconductor substrate to expose the isolation structure, the dummy epitaxial structure, and the lower portion of the fin structure before the opening is formed.

19. The method for forming a semiconductor device structure as claimed in claim 16, further comprising:
    forming a dielectric fin over the isolation structure, wherein the dielectric fin has a third height, and the third height is greater than the second height of the isolation structure.

20. The method for forming a semiconductor device structure as claimed in claim 19, wherein a ratio of the third height to the second height is in a range from about 1.1 to about 1.8.

* * * * *